(12) United States Patent
Nishimori

(10) Patent No.: US 12,740,204 B2
(45) Date of Patent: Sep. 15, 2026

(54) METHOD OF MANUFACTURING LIGHT EMITTING DEVICE AND LIGHT EMITTING DEVICE

(71) Applicant: NICHIA CORPORATION, Anan (JP)

(72) Inventor: Takehiro Nishimori, Anan (JP)

(73) Assignee: NICHIA CORPORATION, Anan (JP)

( * ) Notice: Subject to any disclaimer, the term of this patent is extended or adjusted under 35 U.S.C. 154(b) by 368 days.

(21) Appl. No.: 18/471,293

(22) Filed: Sep. 21, 2023

(65) Prior Publication Data

US 2024/0105891 A1 Mar. 28, 2024

(30) Foreign Application Priority Data

Sep. 28, 2022 (JP) ................................. 2022-155531

(51) Int. Cl.
*H10H 20/856* (2025.01)
*H10H 20/01* (2025.01)
*H10W 90/00* (2026.01)

(52) U.S. Cl.
CPC .......... *H10H 20/856* (2025.01); *H10W 90/00* (2026.01); *H10H 20/0363* (2025.01)

(58) Field of Classification Search
None
See application file for complete search history.

(56) References Cited

U.S. PATENT DOCUMENTS 10,347,806 B2 * 7/2019 Liu .................... G02B 19/0014
2012/0327649 A1 * 12/2012 Harbers .................... F21K 9/64 362/230
2013/0183787 A1 * 7/2013 Inobe .................. H10H 20/819 438/65
2014/0362570 A1 12/2014 Miyoshi et al.
2015/0084537 A1 * 3/2015 Choi ...................... H05B 45/30 315/250
2015/0311411 A1 10/2015 Yagi et al.
2018/0097159 A1 4/2018 Teranishi et al.
2019/0006568 A1 1/2019 Hayashi
2019/0027660 A1 1/2019 Kurimoto
2019/0244939 A1 8/2019 Liu et al.
(Continued)

FOREIGN PATENT DOCUMENTS

JP 01-258481 10/1989
JP 2010-232644 10/2010
(Continued)

*Primary Examiner* — Khaja Ahmad
(74) *Attorney, Agent, or Firm* — MORI & WARD, LLP

(57) ABSTRACT

A method of manufacturing a light emitting device includes providing an intermediate body having a light emitting element, a bottom part on which the light emitting element is disposed, and a first wall disposed on the bottom part and surrounding the light emitting element apart from a lateral face of the light emitting element. The method further includes disposing a light transmissive member having a height in excess of the height of the first wall and covering the upper face of the first wall and the light emitting element, forming a first groove by removing a portion of the light transmissive member thereby exposing at least a portion of the upper face of the first wall, forming a second wall by disposing a first resin in the first groove, and cutting the second wall along a lengthwise direction of the first groove thereby obtaining the light emitting device.

14 Claims, 18 Drawing Sheets

(56) References Cited

U.S. PATENT DOCUMENTS

| | | | | |
|---|---|---|---|---|
| 2020/0105978 | A1 | 4/2020 | Sakamoto et al. | |
| 2020/0227373 | A1* | 7/2020 | Song | H10H 20/85 |
| 2021/0028339 | A1* | 1/2021 | Kojima | H10H 20/018 |
| 2023/0135465 | A1* | 5/2023 | Murugan | H10W 90/00<br>257/91 |

FOREIGN PATENT DOCUMENTS

| | | |
|---|---|---|
| JP | 2014-026065 | 2/2014 |
| JP | 2014-039071 | 2/2014 |
| JP | 2014-236175 | 12/2014 |
| JP | 2015-035592 | 2/2015 |
| JP | WO2016/194120 | 12/2016 |
| JP | 2017-199757 | 11/2017 |
| JP | 2018-088485 | 6/2018 |
| JP | 2019-009429 | 1/2019 |
| JP | 2019-134025 | 8/2019 |
| JP | 2019-533905 | 11/2019 |
| JP | 2020-053604 | 4/2020 |
| JP | 2020-188094 | 11/2020 |
| JP | 2021-064698 | 4/2021 |

* cited by examiner

FIG. 7A
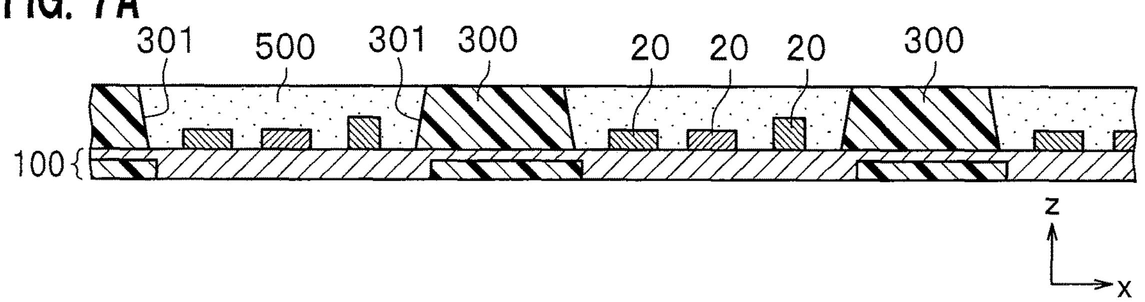
301
500
301
300
20
20
20
300
100
z
x
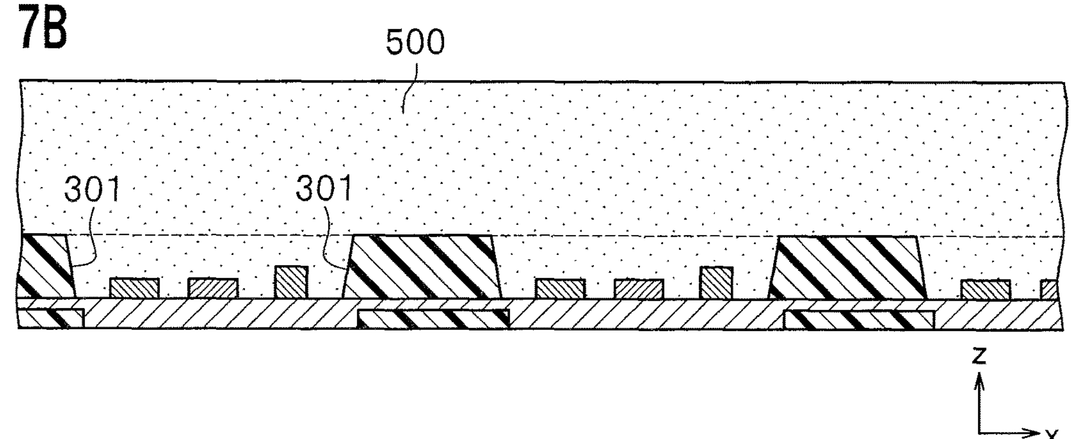
FIG. 7B
500
301
301
z
x
FIG. 7C
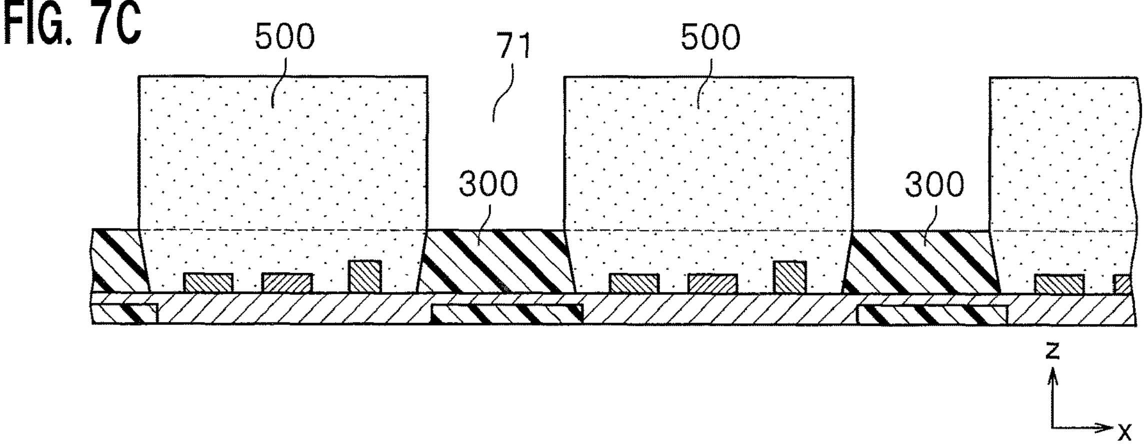
500
71
500
300
300
z
x
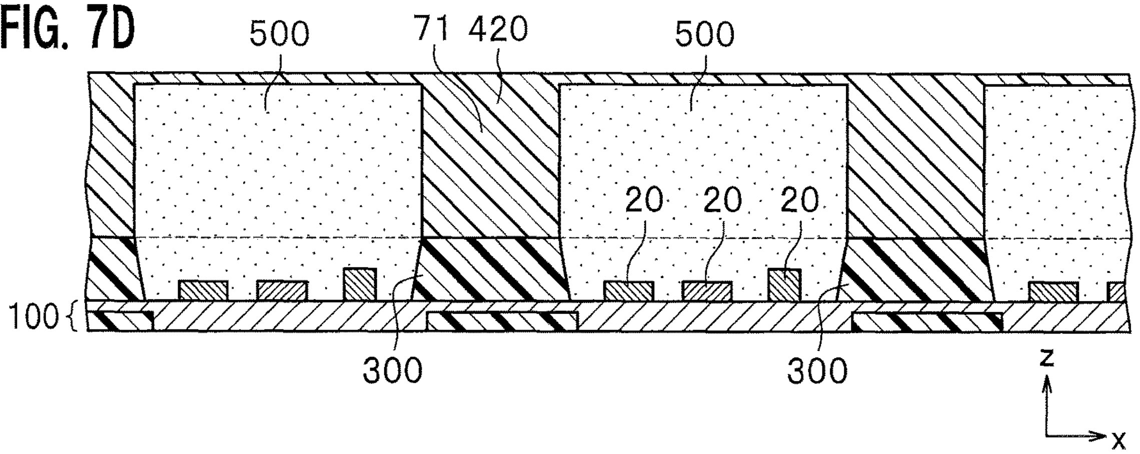
FIG. 7D
500
71
420
500
20
20
20
100
300
300
z
x 1
1
z
x

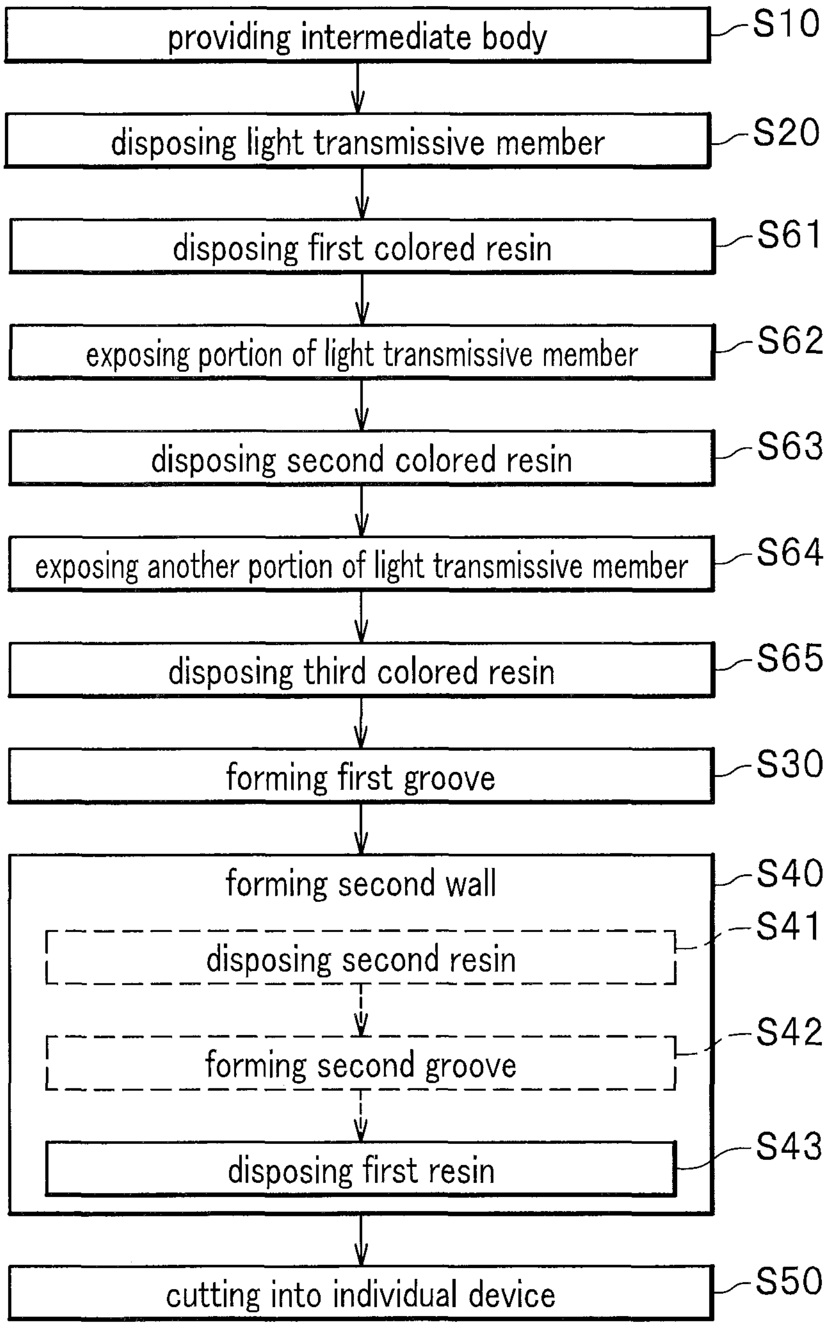
FIG. 8
providing intermediate body
S10
disposing light transmissive member
S20
disposing first colored resin
S61
exposing portion of light transmissive member
S62
disposing second colored resin
S63
exposing another portion of light transmissive member
S64
disposing third colored resin
S65
forming first groove
S30
forming second wall
S40
disposing second resin
S41
forming second groove
S42
disposing first resin
S43
cutting into individual device
S50

500,530A
300
20
20
20
300
100
z
x 300
500,530C
300
500,530A
500,530A
z
x 500,530B
P1
300
500,530C
300
500,530A
500,530A
z
x 500,530B
500,530C
300
300
500,530A
500,530A
z
x

METHOD OF MANUFACTURING LIGHT EMITTING DEVICE AND LIGHT EMITTING DEVICE

CROSS-REFERENCE TO RELATED APPLICATION

This application claims priority to Japanese Patent Application No. 2022-155531, filed on Sep. 28, 2022, the disclosure of which is hereby incorporated by reference in its entirety.

TECHNICAL FIELD

The present disclosure relates to a method of manufacturing a light emitting device and a light emitting device.

BACKGROUND

WO2016-194120, for example, describes a package which includes a formed body having a sheet-shaped base for placing a light-emitting diode (LED) chip and a wall part risen from the sheet-shaped base that has inner faces surrounding the LED chip entirely, and first and second leads attached to the formed body.

SUMMARY

It has been determined that there is a need for a method of manufacturing a light emitting device having increased contrast ratio between the lit state and the unlit state, and such a light emitting device.

A method of manufacturing a light emitting device according to one embodiment includes: providing an intermediate body having a light emitting element, a bottom part on which the light emitting element is disposed, and a first wall disposed on the bottom part and surrounding the light emitting element apart from the lateral faces of the light emitting element; disposing a light transmissive member having a height in excess of the height of the first wall and covering the upper face of the first wall and the light emitting element; forming a first groove by removing a portion of the light transmissive member thereby exposing at least a portion of the upper face of the first wall; forming a second wall by disposing a first resin in the first groove; and cutting the second wall in the first groove along a lengthwise direction of the first groove thereby obtaining the light emitting device.

A light emitting device disclosed by the embodiment includes a base having a first wall, a light emitting element disposed on the base and surrounded by the first wall in a plan view, a second wall positioned on an upper face of the first wall, the second wall having a light shielding part and a light reflecting part, the light reflecting part having a higher light reflectance than the light shielding part, and a light transmissive member disposed in a cavity that is defined by the base and the second wall, wherein the light shielding part and the light reflecting part both contain a resin, an outer lateral face of the second wall and an outer lateral face of the first wall are continuously formed, the light reflecting part partly constitutes an inner lateral face of the second wall, and the light shielding part constitutes the outer lateral face and an upper face of the second wall.

According to an embodiment of the present disclosure, a method of manufacturing a light emitting device having increased contrast ratio between the lit state and the unlit state and such a light emitting device can be provided.

BRIEF DESCRIPTION OF THE DRAWINGS

Figure 1A:
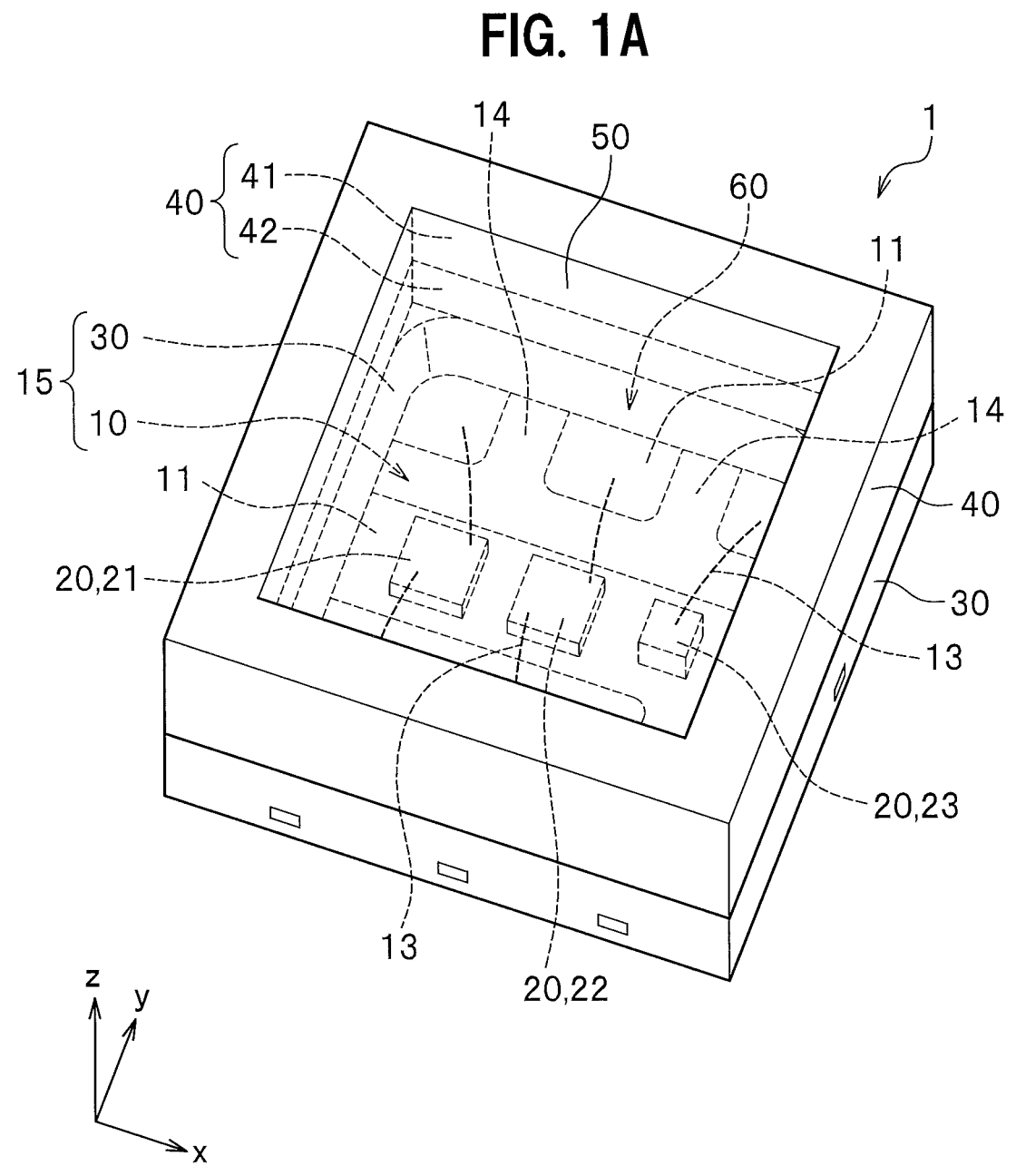

FIG. 1A is a perspective view illustrating a light emitting device according to a first embodiment.

FIG. 7A is a schematic cross-sectional view illustrating a method of manufacturing a light emitting device according to the first embodiment.

FIG. 7B is a schematic cross-sectional view illustrating the method of manufacturing a light emitting device according to the first embodiment.

FIG. 7C is a schematic cross-sectional view illustrating the method of manufacturing a light emitting device according to the first embodiment.

FIG. 7D is a schematic cross-sectional view illustrating the method of manufacturing a light emitting device according to the first embodiment.

FIG. 8 is a flowchart of another method of manufacturing a light emitting device.

DETAILED DESCRIPTION

Figure 1B:
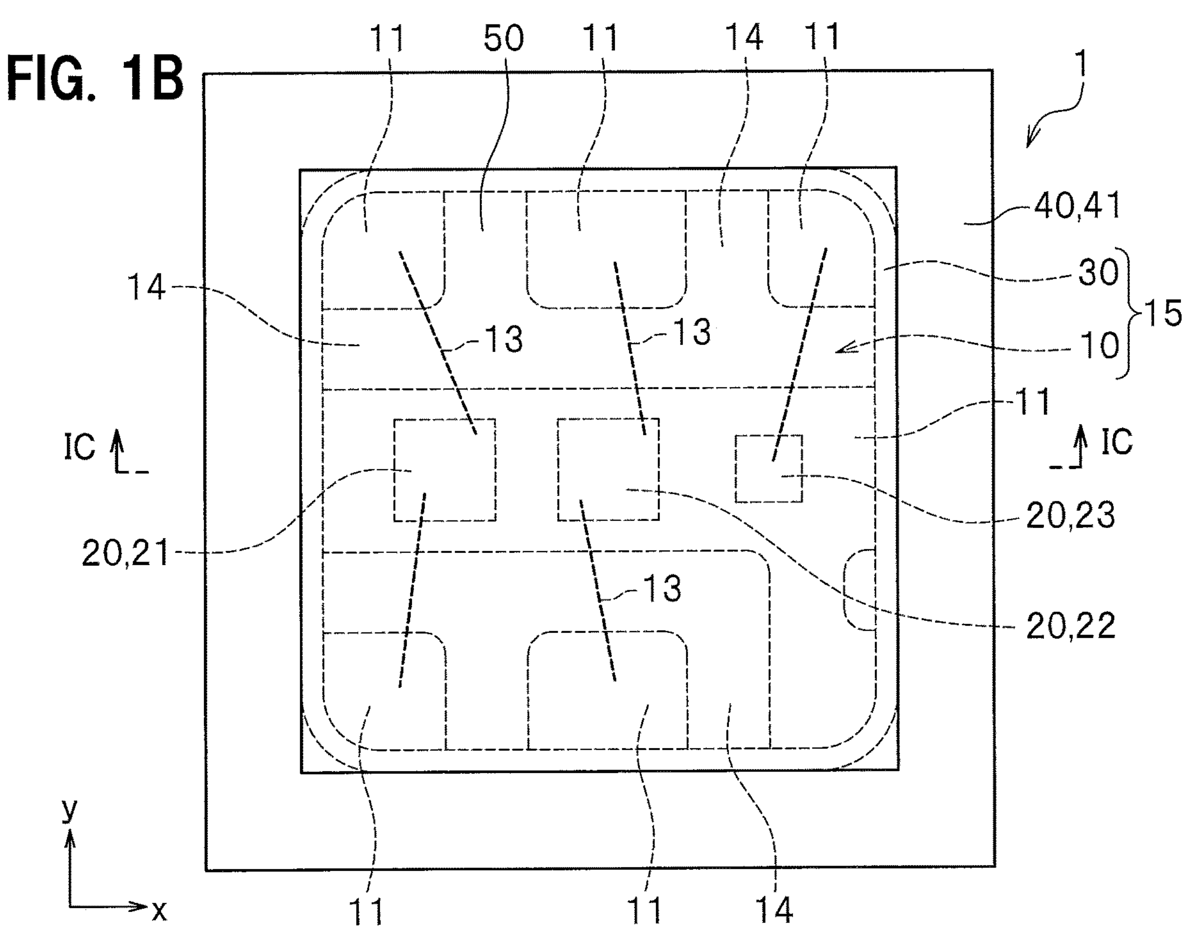
FIG. 1B is a schematic plan view illustrating the light emitting device according to the first embodiment.

Certain embodiments of the present disclosure will be explained with reference to the accompanying drawings. The embodiments described below are provided to give shape to the technical ideas of the present disclosure, and do not limit the invention to those described below unless otherwise specifically noted. The content described with reference to one embodiment is applicable to other embodiments and variations. The drawings are schematic representation of the embodiments in which the scale, spacing, positional relationships of the members may be exaggerated or partly omitted for clarity of explanation. The directions indicated in the drawings show the relative positions of the constituent elements, and are not intended to show the absolute positions thereof. The same designations or reference numerals basically show the same members or those of similar quality, for which detailed explanation will be omitted as appropriate. In the embodiments, "covering" includes not only a member directly covering an object, but also a member indirectly covering an object via another member. In the present specification, "being perpendicular" includes not only strictly being perpendicular, but also practically perpendicular which includes manufacturing tolerances, for example. Being practically perpendicular here tolerates a deviation of up to about 5 degrees, for example.

Light Emitting Device According to First Embodiment

Figure 1C:
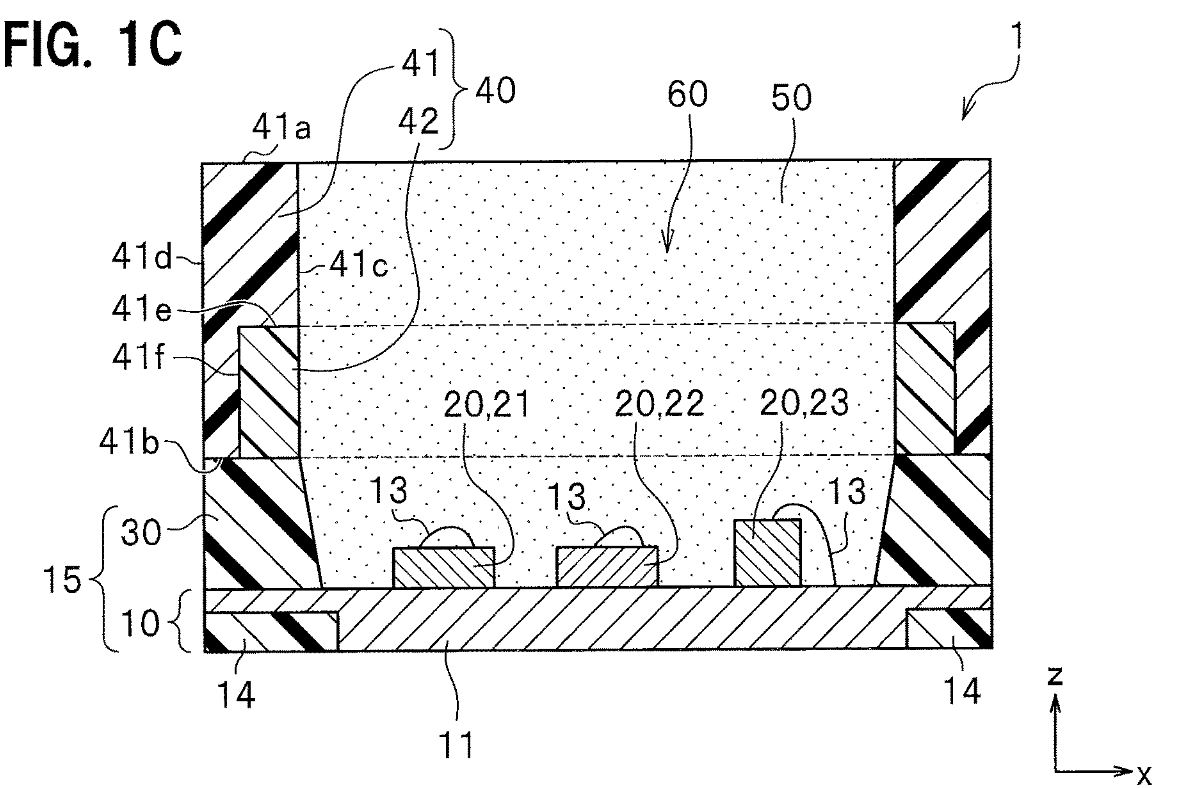
FIG. 1C is a schematic cross-sectional view taken along line IC-IC in FIG. 1B.

A light emitting device 1 according to a first embodiment will be explained with reference to FIG. 1A to FIG. 1C. FIG. 1A is a perspective view illustrating the light emitting device 1. FIG. 1B is a schematic plan view of the light emitting device 1. FIG. 1C is a schematic cross-sectional view taken along line IC-IC in FIG. 1B.

In FIG. 1A to FIG. 1C, arrows showing x, y, and z directions which are orthogonal to one another are provided for reference purposes. These arrows might be used in other drawings to indicate the same directions.

Unless otherwise specifically stated, the "up and down direction" refers to the direction along the z direction, a cross-sectional view refers to an x-z cross section that includes the x and z directions, and a plan view refers to an x-y plane including the x and y directions viewed from the +z direction. Moreover, a "width" refers to the distance in the x direction in an x-z cross section and a "height" refers to the distance in the z direction in an x-z cross section.

The light emitting device 1 includes a base 15 including: a first wall 30; a light emitting element 20 disposed on the base 15 and surrounded by the first wall 30 in a plan view; a second wall 40 positioned on the upper face of the first wall 30, the second wall 40 having a light shielding part 41 and a light reflecting part 42 that has a light reflectance higher than a light reflectance of the light shielding part 41; and a light transmissive member 50 disposed in a cavity 60 defined by the base 15 and the second wall 40. The light shielding part 41 and the light reflecting part 42 both contain a resin. The outer lateral faces of the second wall 40 and the outer lateral faces of the first wall 30 are formed continuously. The light reflecting part 42 partly constitutes the inner lateral faces of the second wall 40. The light shielding part 41 constitutes the outer lateral faces and the upper face of the second wall 40. Each constituent of the light emitting device 1 will be explained below.

Base

A base 15 is a member in which a light emitting element 20 is disposed. The base 15 includes a bottom part 10 and a first wall 30. The bottom part 10 and the first wall 30 can be formed integrally or separately. In a plan view, the base 15 is a quadrangle, for example. The planar shape of the base 15 can be circular, elliptical, polygonal such as a hexagonal, or polygonal with rounded corners. In a cross section, the base 15 has a recessed shape, using the bottom part 10 as the bottom face and the first wall 30 as the lateral faces.

The bottom part 10 has a mounting face on which a light emitting element 20 is disposed. The mounting face is located in the upper face of the bottom part 10.

The first wall 30 is a member disposed on the bottom part 10. The first wall 30 is disposed on the peripheral portion of the upper face of the bottom part 10. In a plan view, the first wall 30 surrounds a light emitting element 20 spaced apart from the lateral faces of the light emitting element 20. In the example shown in FIG. 1B, the first wall 30 which has a rectangular annular shape surrounds the four sides of the light emitting elements 20. The base 15 has an opening defined by the first wall 30. The planar shape of the opening is, for example, a quadrangle. The planar shape of the opening can be circular, elliptical, polygonal such as a hexagonal, or polygonal with rounded corners. In a plan view, moreover, the distance between the inner lateral faces and the outer lateral faces in the upper face of the first wall 30 is practically constant except for the corners.

The cross-sectional shape of the first wall 30 is a trapezoid having practically a right angle as one of the base angles and an acute angle as the other base angle. In a cross section, the inner lateral faces of the first wall 30 are preferably oblique faces that spread in the direction from the bottom part 10 towards the light extraction face of the light emitting device 1 (the +z direction in FIG. 1C). The inner lateral faces of the first wall 30 are oblique such that the inner perimeter of a cavity in a plan view increases from the bottom part 10 towards the top. This allows the first wall 30 if provided with light reflectivity to readily reflect the light emitted from the lateral faces of the light emitting elements 20 towards the upper face, i.e., the light extraction face, thereby improving the light extraction from the light emitting device 1. The outer lateral faces of the first wall 30 in a cross section are substantially perpendicular to the bottom part 10.

The position of the upper face of the first wall 30 is preferably higher than the upper faces of the light emitting elements 20. In the light emitting device 1, the position of the upper face of the first wall 30 is preferably higher than the highest points of the wires 13. More preferably, the position of the upper face of the first wall 30 is higher than the upper faces of the light emitting elements 20 by at least 0.2 mm. The upper face of the first wall 30 can be flat or have a portion having a different height. In the case in which the upper face of the first wall 30 has portions having different height from each other, it only needs the highest position being higher than the upper faces of the light emitting elements 20.

The first wall 30 preferably has light reflectivity. The first wall 30 preferably has a light reflectance of 60% or higher, more preferably 70% or higher, even more preferably 80% or higher with respect to the peak emission wavelength of the light emitted by the light emitting elements 20. This can allow the first wall 30 to reflect the light laterally emitted from the light emitting elements 20. This can increase the light extraction from the light emitting device 1. This can also reduce the leakage of light from the lateral faces of the first wall 30 to the outside. The first wall 30 is, for example, white colored.

The first wall 30 can have a light absorbing property. The first wall 30 can be, for example, black or gray colored.

In the light emitting device 1, the base 15 includes, for example, a lead 11 and a resin part 14. The resin part 14 securely supports the lead 11 which is partly embedded therein. The lead 11 being electrically connected to the negative or positive electrode of the pair of electrodes of a light emitting element 20 can supply electricity to the light emitting element 20.

The first wall 30 is a portion of the resin part 14. The first wall 30 is the portion of the resin part 14 located higher than the upper face of the lead 11.

The bottom part 10 is composed of the lead 11 and a portion of the resin part 14. The mounting face of the bottom part 10 is a portion of the lead 11 exposed from a portion of the resin part 14. The mounting face can be composed of a portion of the resin part 14 and a portion of the lead 11, or only of a portion of the resin part 14.

In a plan view, the resin part 14 of the bottom part 10 is located between the lead 11 on which the light emitting elements 20 are disposed and the leads 11 that are respectively connected to the wires 13 which are electrically connected to the light emitting elements 20. Accordingly, the resin part 14 electrically insulates the leads 11 that are apart from one another. There can be only a pair of leads 11, or two or more pairs of leads 11. The light emitting device 1 includes three pairs of leads 11. The light emitting elements 20 are placed on a single lead 11. In the case of disposing multiple light emitting elements 20, they can be respectively disposed on multiple leads 11.

The lower face of the light emitting device 1 can be partly composed of a lead 11. This can allow the heat generated by the light emitting device 1 to transfer via the lead 11 to the external mounting substrate on which the light emitting device 11 is mounted. This can improve the heat dissipation performance of the light emitting device 1. The leads 11 can be partly exposed at the lateral faces of the first wall 30. In the lower face of the bottom part 10, the leads 11 can be partly exposed. The partly exposed leads 11 at the lower face of the bottom part 10 can serve as the external connection terminals.

The resin part 14 is, for example, one formed of a resin used as the base material which contains a light diffusing material. The resin part 14 preferably has a light reflectance of 60% or higher, more preferably 90% or higher, with respect to the peak emission wavelength of the light emitted by the light emitting elements 20. The light reflectance of the resin part 14 can be suitably adjusted by the type or the amount of the light diffusing material contained therein. Including a light diffusing material allows for the adjustment of the viscosity of the resin part 14.

For the resin used as the base material for the resin part 14, for example, a thermosetting resin, such as an epoxy resin, modified epoxy resin, silicone resin, modified silicone resin, acrylate resin, urethane resin, or the like can be used. For the resin used as the base material for the resin part 14, a thermoplastic resin, such as an acrylic resin, polycarbonate resin, cyclic polyolefin resin, polyethylene terephthalate, polyester resin, or the like can be used. For the light diffusing material, for example, titanium oxide, silicon dioxide, aluminum oxide, zinc oxide, or glass can be used. For the resin part 14, one formed of a silicone or epoxy resin as the base material which contains silicon dioxide as the light diffusing material is preferably used. This can reduce the linear expansion coefficient difference from that of the light emitting elements 20.

For the material for the leads 11, for example, a metal, such as copper, iron, nickel, tungsten, chromium, aluminum, titanium, palladium, rhodium, silver, platinum, gold or the like, or an alloy of these can be used. The leads 11 can be of a single layer or a multilayer body. For the leads 11, copper which is inexpensive and has high heat dissipation performance is preferably used. The leads 11 can be plated with a single layer or multiple layers in part or whole. For the purpose of improving the reflectivity, silver, aluminum, copper, gold, or the like can be used for the plating. In the case in which a metal layer containing silver is the outermost layer of a lead 11, a protective layer formed of silicon oxide or the like is preferably applied to the surface of the silver-containing metal layer. This can make the silver-containing metal layer less susceptible to discoloration attributable to the sulfur component of the air or the like.

Light Emitting Element

A light emitting element 20 is disposed on the base 15. A light emitting element 20 is a semiconductor element that emits light when a voltage is applied, and known semiconductor elements constructed with a nitride semiconductor or the like can be applied.

A light emitting element 20 includes at least a semiconductor body, and has a pair of positive and negative electrodes. The semiconductor body includes an n-side semiconductor layer, a p-side semiconductor layer, and an active layer interposed between the n-side semiconductor layer and the p-side semiconductor layer. The active layer can be a single quantum well (SQW) body or a multiple quantum well (MQW) body including a plurality of well layers. The semiconductor body includes a plurality of semiconductor layers formed of nitride semiconductors. Nitride semiconductors include semiconductors of all compositions obtained by varying the composition ratio x and y within their ranges in the chemical formula $In_xAl_yGa_{1-x-y}N$ ($0 \leq x \leq 1$, $0 \leq y \leq 1$, $x+y \leq 1$). The peak wavelength of the light emitted by the active layer can be suitably selected in accordance with the purpose. The active layer is constructed to be able to emit visible light or ultraviolet light, for example.

The semiconductor body can include multiple light emitting parts each including an n-side semiconductor layer, an active layer, and a p-side semiconductor layer. When the semiconductor body includes multiple light emitting parts, the well layers in the light emitting parts can emit light having different peak emission wavelengths or the same peak emission wavelength. The same peak emission wavelength can include a variation of about several nanometers. A combination of peak emission wavelengths of the light from such light emitting parts can be suitably selected. For example, in the case where the semiconductor body includes two light emitting parts, combinations of the light emitted by the light emitting parts include blue light and blue light, green light and green light, red light and red light, ultraviolet light and ultraviolet light, blue light and green light, blue light and red light, green light and red light, or the like. For example, in the case where the semiconductor body includes three light emitting parts, combinations of the light emitted by the light emitting parts include blue light, green light, and red light. Each light emitting part can include one or more well layers emitting light having different peak emission wavelengths from that of the light from other well layers.

A single or multiple light emitting elements 20 can be disposed on the base 15. In the case of disposing multiple light emitting elements 20, the peak wavelengths of the light or the emission colors of the light emitting elements 20 can be the same. The peak wavelengths of the light or the emission colors of the light emitting elements 20 can be different. The light emitting device 1, as an example, includes a blue light emitting element 21, a green light emitting element 22, and a red light emitting element 23. The light emitting elements 21, 22, and 23 might occasionally be described collectively as light emitting elements 20.

The light emitting elements 20 can each have a pair of electrodes on the same face. The light emitting elements 20 can each have a pair of electrodes separately located on the two opposing faces. For example, in the light emitting device 1, the light emitting elements 21 and 22 each have a pair of electrodes on their upper faces, while the light emitting element 23 has a pair of electrodes separately located on the upper and lower faces. The pairs of electrodes of the light emitting elements 21 and 22 are connected to leads 11 by using wires 13. The electrode of the light emitting element 23 on the lower face is connected to a lead 11 by using a conductive adhesive or the like, and the electrode on the upper face is connected to a lead 11 by using a wire 13. In the example shown in FIG. 1B, the light emitting elements 21, 22, and 23 are linearly arranged, but can be arranged at the vertices of a triangle.

The light emitting elements 20 can be flip-chip mounted. The light emitting device 1 can have a protective device such as a Zener diode in addition to the light emitting elements 20.

Second Wall

A second wall 40 is a member disposed on the upper face of the first wall 30. The second wall 40 has a rectangular annular shape. In a plan view, the second wall 40 is spaced apart from the lateral faces of the light emitting elements 20. The second wall 40 is located on the periphery of the light emitting device 1, surrounding the emission face of the light emitting device 1. The outer perimeter of the second wall 40 in a plan view is, for example, quadrangular. The outer perimeter of the second wall 40 in a plan view can be circular, elliptical, polygonal such as a hexagonal, or polygonal with rounded corners. The inner perimeter of the second wall 40 in a plan view has a similar shape to that of its outer perimeter. The shape of the inner perimeter of the second wall 40 in a plan view can be different from the outer perimeter shape.

In the example shown in FIG. 1B, moreover, the upper face of the first wall 30 is partly positioned inward of the inner lateral faces of the second wall 40 in part. More specifically, some portions of the corners of the quadrangular annular shaped upper face of the first wall 30 are positioned inward of the inner lateral faces of the second wall 40 of the light emitting device 1. Portions of the inner lateral faces of the second wall 40 being aligned with or positioned outward from the inner lateral faces of the first wall 30 in this manner can make it more difficult for the second wall 40 to block the light emitted from the light emitting elements 20.

The cross-sectional shape of the second wall 40 is a quadrangle. The inner and outer lateral faces of the second wall 40 are preferably orthogonal to the bottom part 10. The position of at least a portion of the inner surface of the second wall 40 to the light emitting element 20 can be closer than the position of at least a portion of the inner surface of the first wall 30 to the light emitting element 20 while the inner surface of the second wall 40 is positioned outward from the areas immediately above the light emitting element 20 in cross-sectional view. The inner lateral faces of the second wall 40 are preferably not positioned inward of the inner lateral faces of the first wall 30 (on the light emitting element side) in a cross section. This can make it difficult for the inner lateral faces of the second wall 40 to block the light emitted from the light emitting elements 20. In a cross section, the inner lateral faces of the second wall 40 can be positioned outward from the inner lateral faces of the first wall 30. The outer lateral faces of the second wall 40 are formed continuously with the outer lateral faces of the first wall 30. The outer lateral faces of the second wall 40 are aligned with the outer lateral faces of the first wall 30 to form the same planes. The outer lateral faces of the first wall 30 and the outer lateral faces of the second wall 40 are coplanar. In a cross section, the length of the second wall 40 in the x direction is the same as or smaller than the length of the first wall 30 at the upper face in the x direction. In a cross section, the length of the second wall 40 in the x direction is preferably constant. The height of the light emitting device 1 can be adjusted by changing the height of the second wall 40. Because the height adjustment is made by placing the second wall 40 on the upper face of the first wall 30, the height can be adjusted without changing the dimensions of the light emitting device 1 in the x and y directions.

The upper face of the second wall 40 is formed to be flat. The upper face of the second wall 40 can have a portion having a different height.

The second wall 40 of the light emitting device 1 has a light shielding part 41 and a light reflecting part 42.

Light Shielding Part

A light shielding part 41 is a member having a light shielding property with respect to the light from the light emitting elements 20. The light shielding part 41 is located on the upper face of the first wall 30. The light shielding part 41 has a lower light transmission than that of the light reflecting part 42 with respect to the peak wavelength of the light from the light emitting elements 20.

The cross-sectional shape of the light shielding part 41 has an upper face 41*a*, a lower face 41*b*, inner lateral faces 41*c*, and outer lateral faces 41*d*, and a step is provided in the inner lateral faces 41*c*. The step of the light shielding part 41 has the step's upper face 41*e* and step's lateral faces 41*f* that connect the lower face 41*b* and the step's upper face 41*e*. The step of the light shielding part 41 located in the inner lateral faces 41*c* is depressed from the light emitting element 20 side to the outer lateral faces 41*d* of the light shielding part 41.

In a cross section, the length of the light shielding part 41 in the x direction at the upper face 41*a* is different from the length of the light shielding part 41 in the x direction at the lower face 41*b*. The length of the light shielding part 41 in the x direction at the upper face 41*a* can be larger than the length of the light shielding part 41 in the x direction at the lower face 41*b*.

The upper face 41*a* of the light shielding part 41 constitutes the upper face of the second wall 40 and the outer lateral faces 41*d* of the light shielding part 41 constitute the outer lateral faces of the second wall 40. This can suppress the light emitting device 1 from being visually recognized as whitish when viewed from a distance. This can increase the contrast ratio between the lit state and the unlit state of the light emitting device 1. The contrast ratio between the lit state and the unlit state being high refers to the fact that the light emitting device 1 looks dark when not lit. The inner lateral faces 41*c* of the light shielding part 41 partly constitute the inner lateral faces of the second wall 40.

The light shielding part 41 is preferably black colored. The light shielding part 41 is, for example, one formed of a resin used as the base material which contains a light absorbing material. The light shielding part 41 is preferably a material that absorbs 70% or more, more preferably 90% or more light or visible light emitted from the light emitting elements 20. The light shielding part 41 can be one that has a light transmission of 40% or less with respect to the peak wavelength of the light from the light emitting elements 20.

For the resin used as the base material for the light shielding part 41, the same or a similar material to that for the resin part 14 can be used. As the light absorbing material, carbon black, pigments, dyes, glass filler colored by carbon black, or the like can be used. For the light shielding part 41, for example, one formed of a silicone resin as the base material which contains carbon black can be used.

Light Reflecting Part

A light reflecting part 42 is a member that has a higher light reflectance than that of the light shielding part 41 with respect to the light from the light emitting elements 20. The light reflecting part 42 constitutes the inner lateral faces of the second wall 40 in part. In a plan view, the distance between the inner lateral faces and the outer lateral faces of the light reflecting part 42 is practically constant. In a plan view, the light reflecting part 42 has practically a quadrangular annular shape. The light reflecting part 42 is placed on the upper face of the first wall 30. In a plan view, the light reflecting part 42 overlaps the light shielding part 41.

The cross-sectional shape of the light reflecting part 42, for example, is a rectangle. The cross-sectional shape of the light reflecting part 42 can be a quadrangle such as a trapezoid. The upper face and the outer lateral faces of the light reflecting part 42 are in contact with the light shielding part 41. The light reflecting part 42 is located in the recess defined by the step's upper face 41*e* and the step's lateral faces 41*f* of the light shielding part 41.

The lower end of the light reflecting part 42 constitutes the lower end of the second wall 40. In a cross section, the length of the light reflecting part 42 in the z direction from the lower end to the upper end is smaller than one-half the length of the second wall 40 in the z direction from the lower end to the upper end. This can increase the contrast ratio between the lit state and the unlit state of the light emitting device 1. The length of the light reflecting part 42 in the z direction is, for example, 35% to 45% of the inner lateral faces of the second wall 40. In a cross section, the length of the light reflecting part 42 in the x direction equals to one half of the length of the second wall 40 in the x direction or larger. This makes it difficult for the light emitted from the light emitting elements 20 to leak from the light reflecting part 42 in the light emitting device 1. The length of the light reflecting part 42 in the x direction can be smaller than one half of the length of the second wall 40 in the x direction.

The light reflecting part 42 is preferably white colored. For the material for the light reflecting part 42, one the same as or a similar to that for the resin part 14 can be used. For the light reflecting part 42, for example, one formed of a silicone resin as the base material which contains titanium oxide as a light diffusing material can be used. For the light reflecting part 42, the same base material as that for the light shielding part 41 can be used. This can make consistent their physical properties such as the coefficient of linear expansion, thereby increasing the stability of the light emitting device 1 against the temperature fluctuations and the like.

The second wall 40 having a light shielding part 41 and a light reflecting part 42 allows the light reflecting part 42 to reflect the light emitted from the light emitting elements 20 towards the light extraction face while allowing the light shielding part 41 to increase the contrast ratio between the lit state and the unlit state of the light emitting device 1.

Cavity

A cavity 60 is defined by the bottom part 10 of the base 15, the first wall 30, and the second wall 40. In the light emitting device 1, the inner lateral faces that define the cavity 60 are constituted of the first wall 30, the light reflecting part 42, and the light shielding part 41. Among the inner lateral faces that define the cavity 60, the light reflecting part 42 is located between the light shielding part 41 and the first wall 30. In other words, in the inner lateral faces that define the cavity 60, the first wall 30, the light reflecting part 42, and the light shielding part 41 are arranged in that order from the bottom part 10 of the base 15 to the top.

Light Transmissive Member

A light transmissive member 50 is a member that is disposed in a cavity 60 and covers the light emitting elements 20 disposed on the base 15. The upper face of the light transmissive member 50 is a flat face. The upper face of the light transmissive member 50 is the light emission face of the light emitting device 1. The upper face of the light transmissive member 50 and the upper face of the second wall 40 are coplanar. The upper face of the light transmissive member 50 can have a portion that has a different height. For example, a portion of the light transmissive member 50 might occasionally be disposed on a portion of the upper face of the second wall 40. The position of the upper face of the light transmissive member 50 disposed on the upper face of the second wall 40 can be higher than the position of the upper face of the light transmissive member 50 that covers the light emitting elements 20.

In a cross section, the light transmissive member 50 can be of a single layer or multiple layers. Because the first wall 30 and the second wall 40 constitute the inner lateral faces that define a cavity 60, the length of the light transmissive member 50 in the z direction is large. This can improve the color mixing in the light emitting device 1. For example, in the case in which the light emitting device 1 includes light emitting elements 21, 22, and 23 that emit light of different peak emission wavelengths, the light emitted from the light emitting elements 21, 22, and 23 is mixed in the light transmissive member 50. The light transmissive member 50 having a large length in the z direction can facilitate the mixing of the light emitted from the light emitting elements 21, 22, and 23.

The light transmissive member 50 is, for example, one formed of a resin as the base material which contains a light diffusing material. The light transmissive member 50 preferably has a light transmittance of 60% or higher, more preferably 80% or higher with respect to the light from the light emitting elements 20. For the base material and the light diffusing material for the light transmissive member 50, the same or similar materials to those for the resin part 14 can be used. The same base material is preferably used for the light shielding part 41, the light reflecting part 42, and the light transmissive member 50. Accordingly, the light shielding part 41, the light reflecting part 42, and the light transmissive member 50 are less likely to be separated from one another. This thus can reduce the leakage of light from between these members. This can also make it difficult for the moisture to penetrate the light emitting device 1 that would otherwise occur if the members are separated. Accordingly, the degradation of the light emitting elements 20 or the like can be reduced, and the reliability of the device increased.

The content of the light diffusing material in the light transmissive member 50 is, for example, 20% to 40% of the base material. When heat applies, the light transmissive member 50 might shrink. For this reason, for example, the light emitting device 1 can occasionally be warped. Setting the content of the light diffusing material in the light transmissive member 50 to 20% or higher can reduce the shrinkage of the light transmissive member 50.

The light transmissive member 50 can contain a wavelength conversion substance. The wavelength conversion substance is a material that absorbs at least a portion of the primary light from the light emitting elements 20 and emits secondary light having a different wavelength from that of the primary light. For example, by mixing the primary light from the light emitting elements 20 and the secondary light from the wavelength conversion substance, white light can be produced.

For the wavelength conversion material, for example, yttrium aluminum garnet based phosphors (e.g., $Y_3(Al,Ga)_5O_{12}$:Ce), lutetium aluminum garnet based phosphors (e.g., $Lu_3(Al,Ga)_5O_{12}$:Ce), terbium aluminum garnet based phosphors (e.g., $Tb_3(Al,Ga)_5O_{12}$:Ce), CCA-based phosphors (e.g., $Ca_{10}(PO_4)_6Cl_2$:Eu), SAE based phosphors (e.g., $Sr_4Al_{14}O_{25}$:Eu), chlorosilicate based phosphors (e.g., $Ca_8MgSi_4O_{16}C_{12}$:Eu), silicate based phosphors (e.g., $(Ba,Sr,Ca,Mg)_2SiO_4$:Eu), oxynitride based phosphors, such as β-SiAlON phosphors (e.g., $(Si,Al)_3(O,N)_4$:Eu) or α-SiAlON phosphors (e.g., $Ca(Si,Al)_{12}(O,N)_{16}$:Eu), LSN-based phosphors (e.g., $(La,Y)_3Si_6N_{11}$:Ce), nitride based phosphors, such as BSESN-based phosphors (e.g., $(Ba,Sr)_2Si_5N_8$:Eu, SLA based phosphors (e.g., $SrLiAl_3N_4$:Eu), CASN-based phosphors (e.g., $CaAlSiN_3$:Eu) or SCASN-based phosphors (e.g., $(Sr,Ca)AlSiN_3$:Eu), fluoride based phosphors, such as KSF-based phosphors (e.g., $K_2SiF_6$:Mn), KSAF-based phosphors (e.g., $K_2(Si_{1-x},Al_x)F_{6-x}$:Mn where x satisfies $0<x<1$), or MGF-based phosphors (e.g., $3.5MgO \cdot 0.5MgF_2 \cdot GeO_2$:Mn), quantum dots having a Perovskite structure (e.g., $(Cs,FA,MA)(Pb,Sn)(F,Cl,Br,I)_3$ where FA and MA represent formamidinium and methylammonium, respectively), group II-VI quantum dots (e.g., CdSe), group III-V quantum dots (e.g., InP), or quantum dots having a chalcopyrite structure (e.g., $(AgCu)(In,Ga)(S,Se)_2$) can be used.

The wavelength conversion substance can be used singly or in combination of two or more of these phosphors.

The light emitting device 1 includes: a base 15 having a first wall 30; and light emitting elements 20 that are disposed on the base 15 and surrounded by the first wall 30 in a plan view. In the light emitting device 1, the second wall 40 is disposed on the upper face of the first wall 30. In the light emitting device 1, the inner lateral faces of the first wall 30 and the inner lateral faces of the second wall 40 can have different obliqueness in a cross section. This can improve the light extraction and the reliability of the light emitting device 1. Making the inner lateral faces of the first wall 30 oblique can improve the light extraction. Making the inner lateral faces of the second wall perpendicular, not oblique, can reduce the separation of the light transmissive member 50 from the second wall 40 attributable to sun light or the like.

The light emitting device 1 includes a light reflecting member 42 having a higher light reflectance than that of the light shielding part 41 as a part of the inner lateral faces of the second wall 42. This can further improve the light extraction efficiency of the light emitting device 1.

In the light emitting device 1, the inner lateral faces that define the cavity 60 are constituted of the first wall 30, the light reflecting part 42, and the light shielding part 41. Among the inner lateral faces that define the cavity 60, the light reflecting part 42 is disposed between the light shielding part 41 and the first wall 30. Accordingly, the first wall 30 and the light reflecting part 42 can increase the brightness in the intermediate portion of the cavity 60 in the depth direction (−z direction), and the light shielding part 41 can increase the contrast ratio between the lit state and the unlit state in the upper portion close to the light emission face of the light emitting device 1.

In the light emitting device 1, the outer lateral faces of the first wall 30 and the outer lateral faces of the second wall 40 are coplanar. For this reason, in a plan view, the outer perimeter of the first wall 30 is basically the same as the outer perimeter of the second wall 40.

The light emitting device 1 has a basic structure as a light emitting device by disposing the light emitting elements 20 on the base 15 and connecting them using wires 13, and disposing the light transmissive member 50 inward of the first wall 30. In such a light emitting device, changing the height of the first wall 30 itself might enlarge the entire light emitting device in some cases. In the case of the light emitting device 1 of the present disclosure, however, the height of the light emitting device 1 in the z direction can be increased by the second wall 40 without altering the base 15.

Variations of Second Wall

Figure 2A:
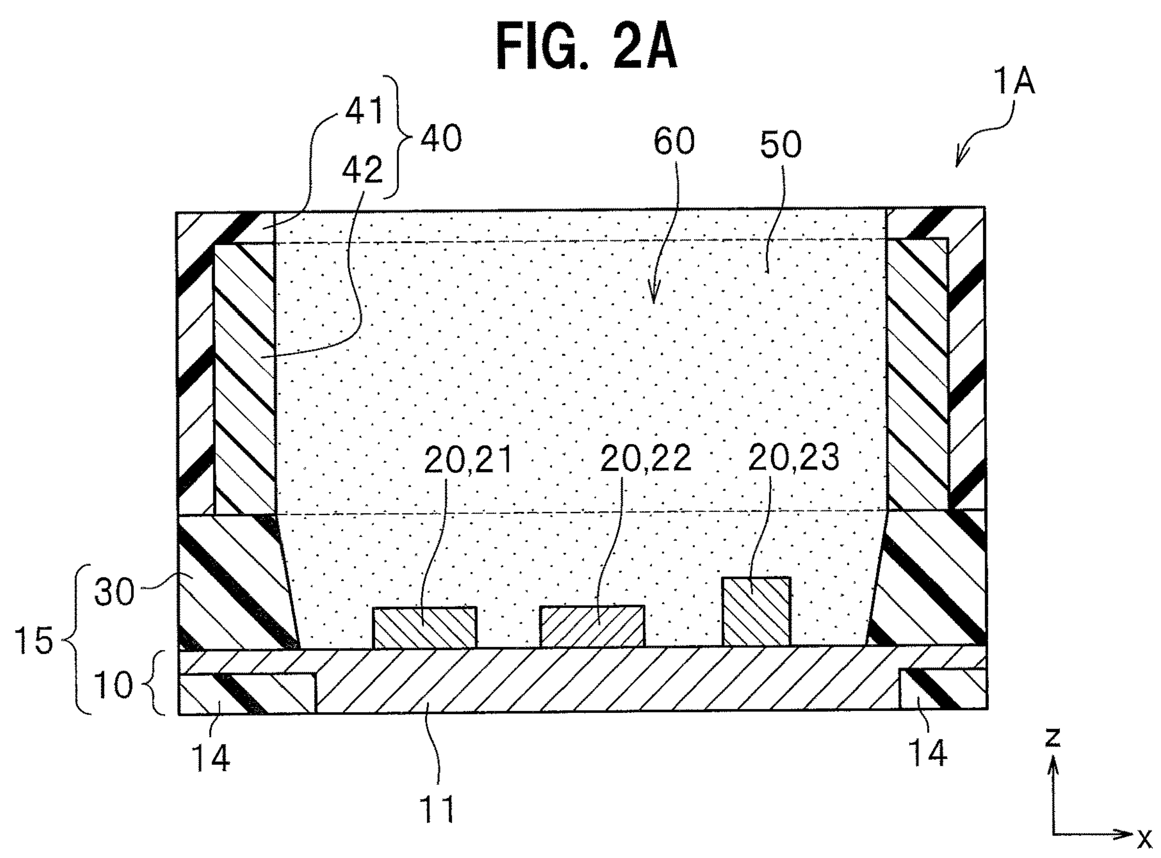
FIG. 2A is a schematic cross-sectional view illustrating a light emitting device having a second wall variation.
Figure 2B:
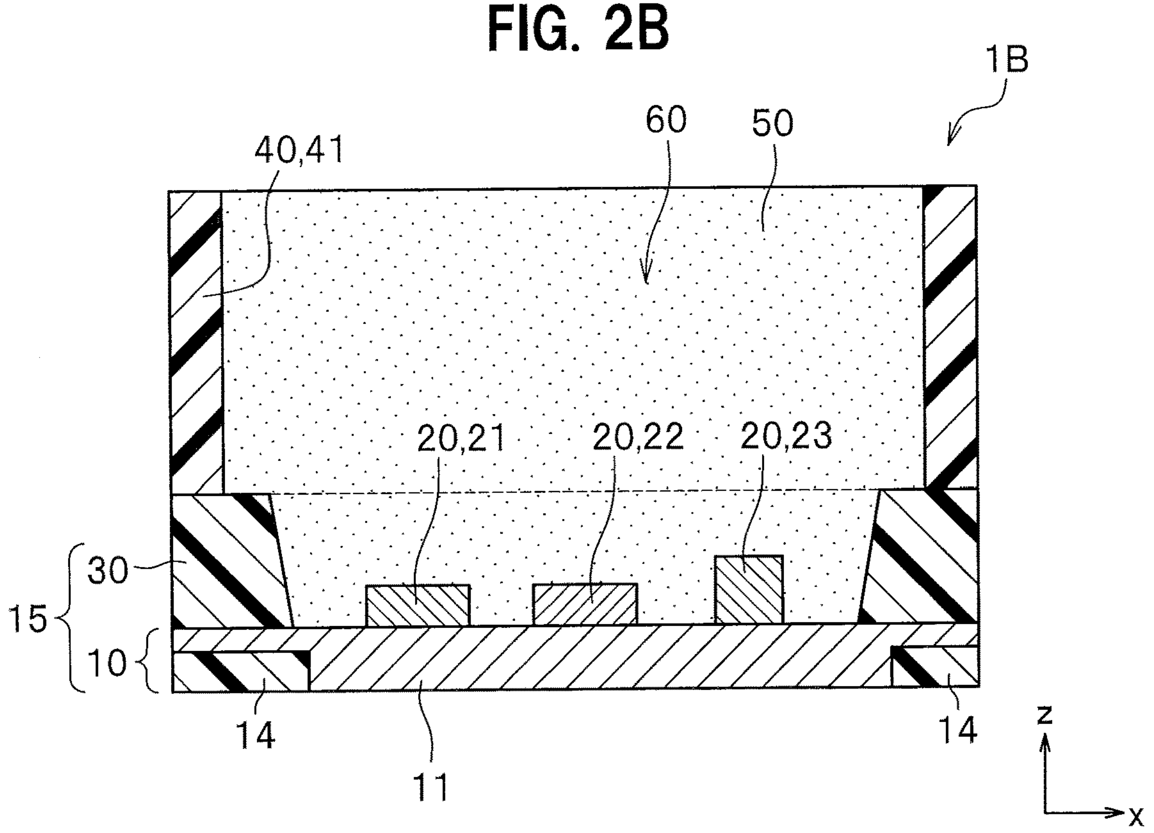
FIG. 2B is a schematic cross-sectional view illustrating a light emitting device having another second wall variation.

Light emitting devices 1A and 1B related to variations of the second wall 40 will be explained next with reference to FIGS. 2A and 2B. FIG. 2A is a schematic cross-sectional view of the light emitting device 1A. FIG. 2B is a schematic cross-sectional view of the light emitting device 1B. In the cross-sectional views from FIG. 2A onwards, wires 13 are not shown.

The light emitting device 1A differs from the light emitting device 1 in terms of the length of the light reflecting part 42 in the z direction from the lower end to the upper end that partly constitutes the inner lateral faces of the second wall 40. The other features are consistent with the light emitting device 1. In a cross section, the length of the light reflecting part 42 in the z direction from the lower end to the upper end equals one half of the length of the second wall 40 or larger. The length of the light reflecting part 42 in the z direction from the lower end to the upper end is, for example, 50% to 90% of the inner lateral faces of the second wall 40.

With an increased areal percentage of the light reflecting part 42 in the inner lateral faces of the second wall 40, the light emitting device 1A can further enhance the brightness increasing effect of the light reflecting part 42.

The light emitting device 1B differs from the light emitting devices 1 and 1A such that the second wall 40 includes no light reflecting part 42. The other features are consistent with the light emitting device 1. In the light emitting device 1B, the inner lateral faces of the second wall 40 are made only of the light shielding part 41.

With the second wall 40 made only of the light shielding part 41, the light emitting device 1B can make the emission face darker when unlit, thereby further increasing the contrast ratio between the lit state and the unlit state.

Variations of Light Transmissive Member

Figure 3A:
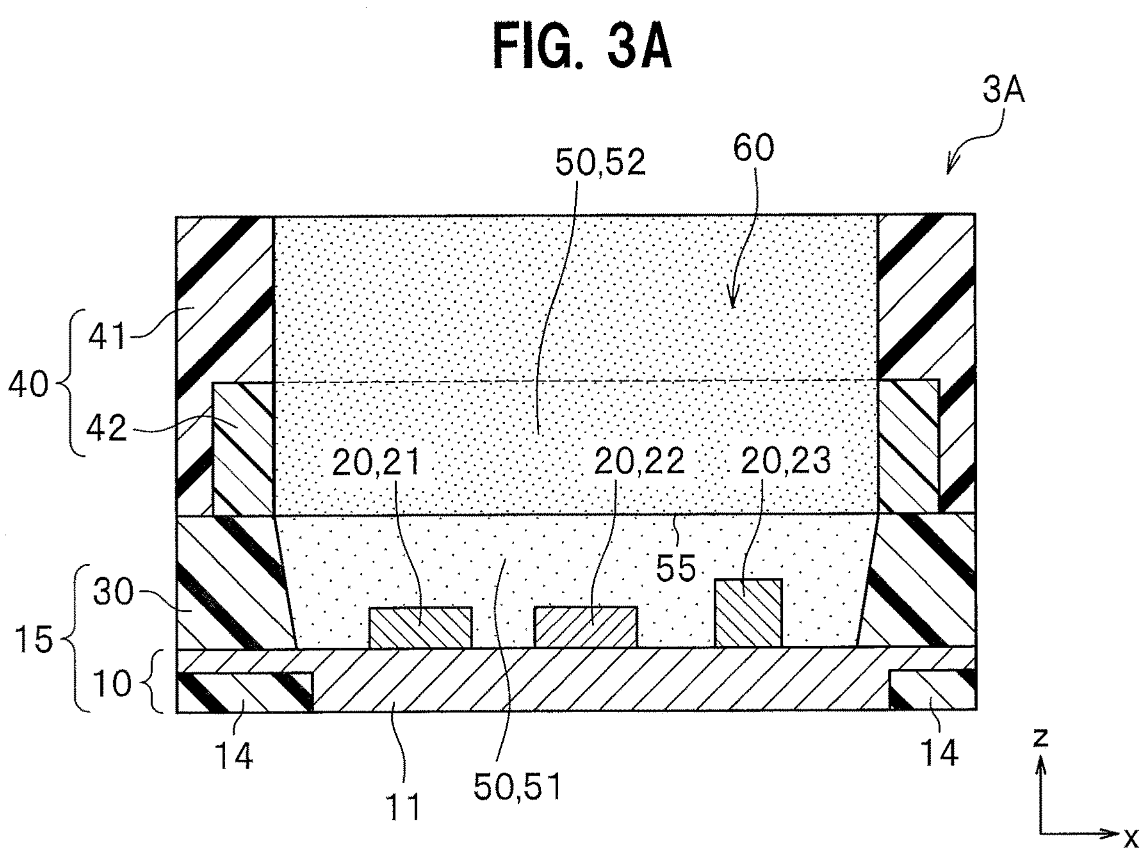
FIG. 3A is a schematic cross-sectional view of a light emitting device having a transmissive member variation.
Figure 3B:
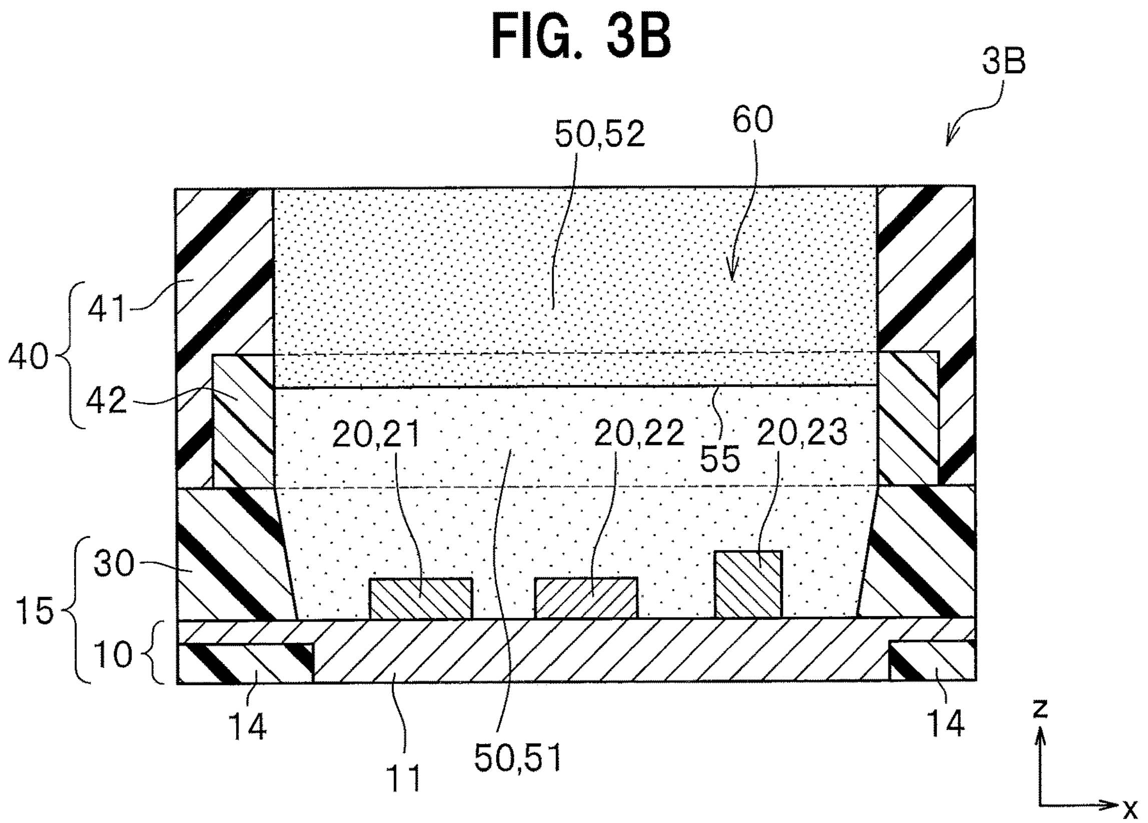
FIG. 3B is a schematic cross-sectional view of a light emitting device having another light transmissive member variation.

Next, light emitting devices 3A and 3B related to variations of the light transmissive member 50 will be explained with reference to FIGS. 3A and 3B. FIG. 3A is a schematic cross-sectional view of the light emitting device 3A. FIG. 3B is a schematic cross-sectional view of the light emitting device 3B.

The light emitting device 3A includes a light transmissive member 50 that is different from that of the light emitting device 1. The other features are consistent with the light emitting device 1. The light transmissive member 50 of the light emitting device 3A is constituted of a lower part 51 that covers the light emitting elements 20 and an upper part 52 located on the lower part 51. The light emitting device 3A can have an interface 55 between the upper part 52 and the lower part 51.

The lower part 51 is the lower portion of the light transmissive member 50 disposed in the cavity 60. The lower part 51 is located on the bottom part 10 side and covers the light emitting elements 20. The lower part 51 is disposed in the portion defined by the first wall 30 and the bottom part 10. The upper part 52 is the upper portion of the light transmissive member 50 disposed in the cavity 60. The upper part 52 forms the emission face. The upper part 52 is disposed in the portion defined by the upper face of the lower part 51 and the second wall 40. In other words, the lower part 51 and the upper part 52 are the two stacked layers in the light transmissive member 50.

For the material for the lower part 51 and the upper part 52, one formed of a resin as the base material which contains a light diffusing material can be used. The lower part 51 and the upper part 52 can be formed of different base materials, or the same base material each containing a different type or amount of light diffusing material.

The light emitting device 3A including a light transmissive member 50 composed of a lower part 51 that covers the light emitting elements and an upper part 52 positioned on the lower part 51 allows the light transmissive member 50 to have different optical properties in the part closer to the light emitting elements 20 and the part closer to the light emission face of the light emitting device 3A. This can allow for finer adjustments of the light from the light emitting device 3A. Furthermore, the physical properties of the lower part 51 and the upper part 52 can be set to match the first wall 30 and the second wall 40, respectively. Accordingly, the reliability of the light emitting device 3A can be further improved.

The light emitting device 3B includes a light transmissive member 50 in which the position of the upper face of the lower part 51 is different from that in the light emitting device 3A. The other features are consistent with the light emitting device 3A. In the light emitting device 3B, the upper face of the lower part 51, as shown in FIG. 3B, is positioned higher than the upper face of the first wall 30. The lower part 51 in the cross section covers the border between the first wall 30 and the second wall 40. The upper part 52 covers the border between the light reflecting part 42 and the light shielding part 41.

As shown in FIG. 3A and FIG. 3B, the light emitting device 3B having a multilayer structure having two or more layers, such as the upper part 52 and the lower part 51, can more finely adjust the properties of the light transmissive member 50.

Light Emitting Device According to Second Embodiment

Figures 4A, 4B:
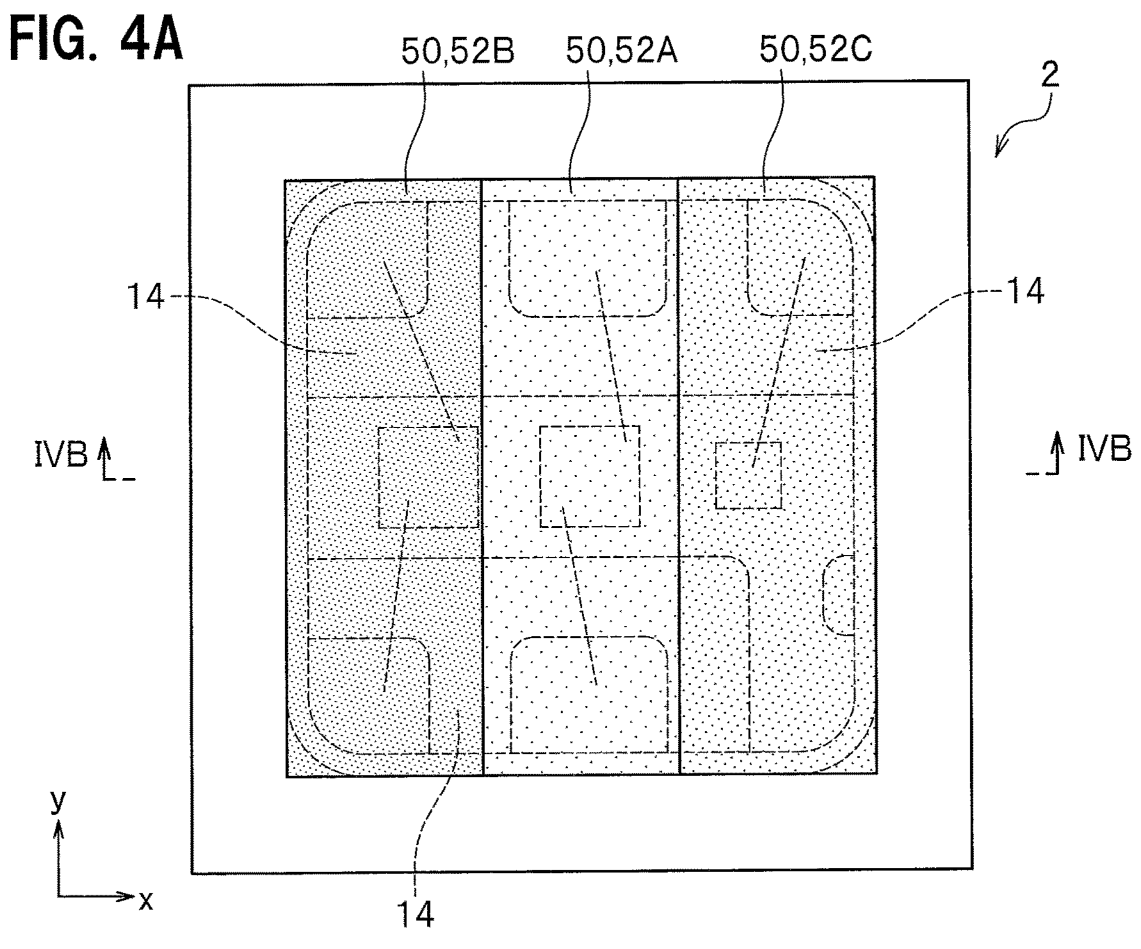
FIG. 4A is a schematic plan view illustrating a light emitting device according to a second embodiment.
FIG. 4B is a schematic cross-sectional view taken along line IVB-IVB in FIG. 4A.

A light emitting device 2 according to a second embodiment will be explained with reference to FIGS. 4A and 4B. FIG. 4A is a schematic plan view of the light emitting device 2. FIG. 4B is a schematic cross-sectional view taken along line IVB-IVB in FIG. 4A.

The light emitting device 2 differs from the light emitting device 1 with respect to the light transmissive member 50, while the other features are consistent with the light emitting device 1. The light transmissive member 50 of the light emitting device 2 is composed of a lower part 51 that covers the light emitting elements 20 and upper parts 52A, 52B, and 52C positioned on the lower part 51. The upper parts 52A, 52B, and 52C might occasionally be described collectively as the upper parts 52.

In the light emitting device 2, the upper parts 52 contain a coloring agent. The upper parts 52 are three regions, 52A, 52B, and 52C, in a plan view. In the plan view, the three upper parts 52A, 52B, and 52C practically divide the light transmissive member 50 into three equal parts in the direction in which the light emitting elements 20 are arranged. In the cross-sectional view, the upper part 52A is disposed above the light emitting element 22, the upper part 52B is disposed above the light emitting element 21, and the upper part 52C is disposed above the light emitting element 23. In the plan view, the light emitting elements 20 do not overlap the borders between the upper part 52A and the upper part 52B and between the upper part 52B and the upper part 52C. Each of the upper parts 52A, 52B, and 52C preferably has different chromaticity from that of an adjacent part. More preferably, they all have different chromaticity from one another.

In the light emitting device 2, the upper parts 52 having corresponding chromaticity to the emission colors of the light emitting element 20 are preferably arranged. A blue colored upper part 52B is positioned above the blue light emitting element 21, a green colored upper part 52A is positioned above the green light emitting element 22, and a red colored upper part 52C is positioned above the red light emitting element 23. The upper parts 52 containing coloring agents can increase the contrast ratio between the lit state and the unlit state.

In the cross-sectional view, the lower ends of the upper parts 52 are located at the same height as that of the upper face of the first wall 30, or higher. This can allow the first wall 30 to readily reflect the light exiting the lateral faces of the light emitting elements 20.

In the cross-sectional view, the lower end of the upper part 52A is positioned higher than the other two parts. Positioning the lower end of the upper part 52A higher can improve the light extraction of the light emitting device 2. Reducing the length of the upper part 52A in the z direction in the cross-sectional view which is located above the green light emitting element 22 which needs to be brightest among red, blue, and green can reduce the absorption of the light by the coloring agent. The lower end of the upper part 52B and the lower end of the upper part 52C can have the same height or different heights. The positions of the lower ends of the upper parts 52B, 52A, and 52C can decrease or increase in that order.

As a coloring agent, one containing either a pigment or dye can be used.

There are no particular restrictions for pigments. For example, there are those that employ inorganic or organic materials which are described below.

Examples of inorganic materials include red iron oxide ($Fe_2O_3$), red lead ($Pb_3O_4$), antimony nickel titanium oxide, barium nickel titanium oxide, antimony chromium titanium oxide, niobium chromium titanium oxide, and the like.

Examples of organic materials include copper phthalocyanate-based, anthraquinone-based, azo-based, quinacridone-based, perylene-based, diketopyrrolopyrrole-based, monoazo-based, disazo-based, pyrazolone-based, benzimidazolon-based, quinoxaline-based, azomethine-based, isoindolinone-based, and isoindoline-based pigments.

There are no particular restrictions for dyes, and examples include anthraquinone-based, methine-based, azomethine-based, oxazine-based, azo-based, styryl-based, coumarin-based, porphyrin-based, dibenzofuranone-based, diketopyrrolopyrrole-based, rhodamine-based, xanthene-based, and pyrromethene-based dyes.

Suitable pigments and dyes are those that do not convert the wavelength of the light from the light emitting elements 20 into a different wavelength. In this manner, they would not affect the wavelength conversion if contained in the light transmissive member 50.

The lower part 51 does not contain a coloring agent. There is an interface 55 between the upper part 52 and the lower part 51. The lower part 51 and the upper part 52 preferably employ the same base material. This makes it difficult for the lower part 51 and the upper part 52 to separate from one another.

In the light emitting device 2, the upper parts 52 that are three divided regions in a plan view have different chromaticity from one another which can make the emission face appear black when unlit even in the presence of external light due to subtractive color mixing. This thus can increase the contrast ratio between the lit state and the unlit state of the light emitting device.

The variations of the second wall described with reference to light emitting devices 1A and 1B and the variations of the light transmissive member described with reference to light emitting devices 3A and 3B can be combined with one another. They can also be combined with the light emitting device 2 according to the second embodiment.

Method of Manufacturing Light Emitting Device According to First Embodiment

Figure 5:
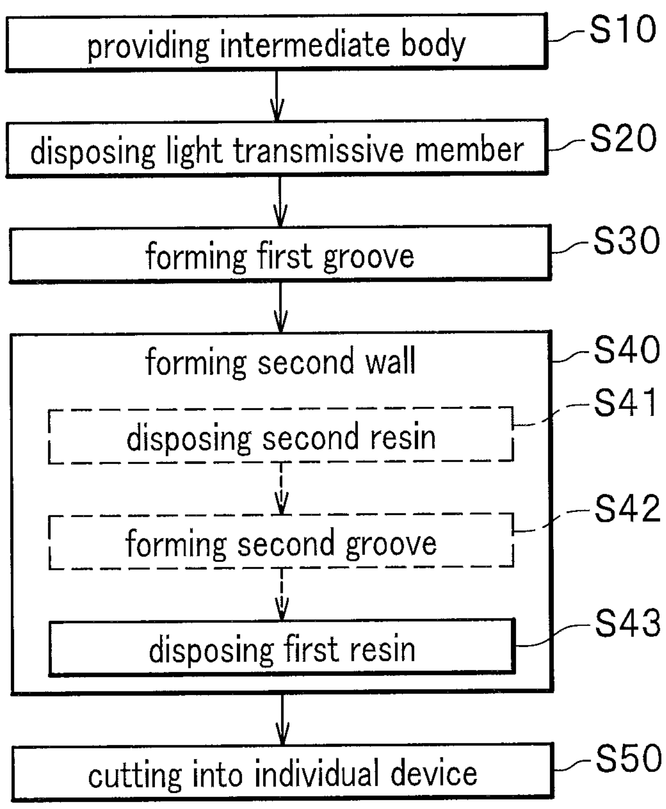
FIG. 5 is a flowchart of a method of manufacturing a light emitting device.
Figure 6A:
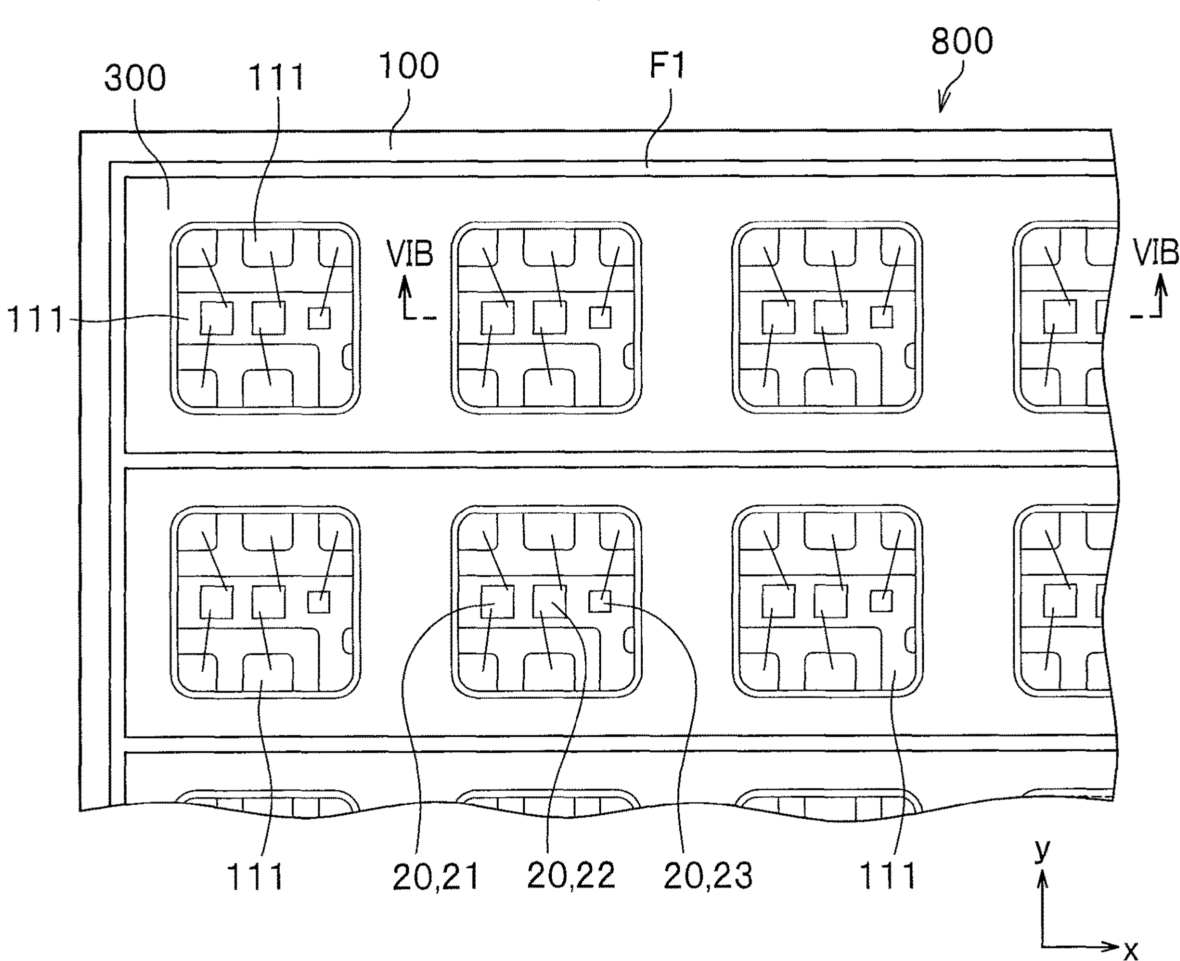
FIG. 6A is a schematic plan view illustrating an intermediate body in the manufacturing method according to an embodiment.
Figure 6B:
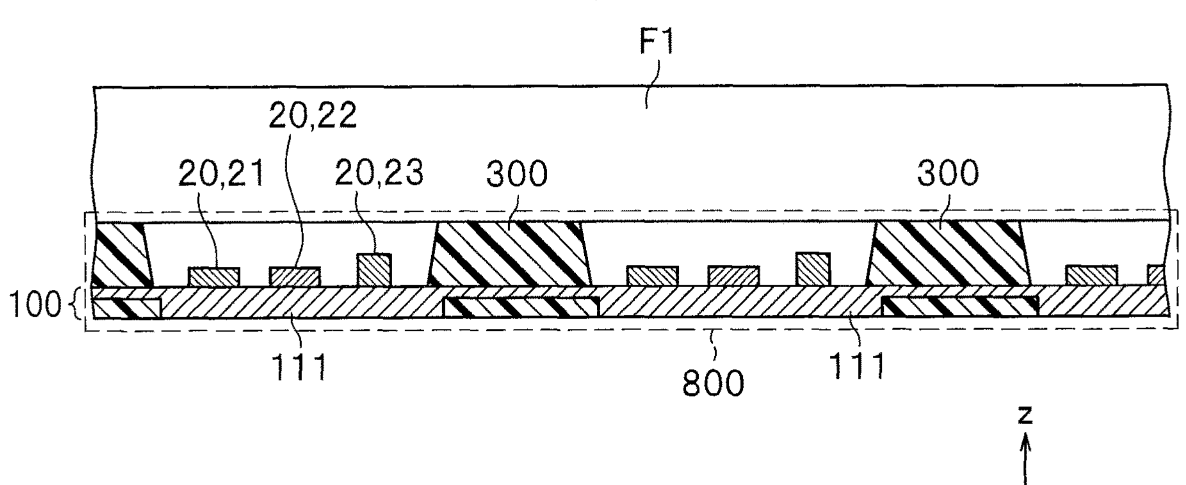
FIG. 6B is a schematic cross-sectional view taken along line VIB-VIB in FIG. 6A.

A method of manufacturing a light emitting device 1 according to the first embodiment will be explained with reference to FIG. 5 to FIG. 7I. FIG. 5 is a flowchart of the method of manufacturing the light emitting device 1. FIG. 6A is a schematic plan view illustrating an intermediate body in the method of manufacturing the light emitting device 1. FIG. 6B is a schematic cross-sectional view taken along line VIB-VIB in FIG. 6A. FIG. 7A to FIG. 7I are schematic cross-sectional views showing the state in the respective steps.

The method of manufacturing the light emitting device 1 includes steps of: providing an intermediate body 800 including a light emitting element 20, the intermediate body 800 having a bottom part 100 on which the light emitting element 20 is disposed, and a first wall 300 disposed on the bottom part 100 and surrounding the light emitting element 20 apart from a lateral face of the light emitting element 20 (S10); disposing a light transmissive member 500 having a height in excess of a height of the first wall 300 and covering an upper face of the first wall 300 and the light emitting element 20 (S20); forming a first groove 71 by removing a portion of the light transmissive member 500 thereby exposing at least a portion of the upper face of the first wall 300 (S30); forming a second wall 400 by disposing a first resin 410 in the first groove 71 (S40); and cutting the second wall 400 along the first groove 71 in a plan view thereby obtaining the light emitting device (S50).

Providing Intermediate Structure

A step S10 of providing an intermediate body will be explained based primarily on FIG. 6A and FIG. 6B. The step S10 of providing an intermediate body is a step of providing an intermediate body 800 including a light emitting element 20, a bottom part 100, and a first wall 300. The bottom part 100 and the first wall 300 in the intermediate body 800 are the parts that will make up the base 15 of a light emitting device 1. The intermediate body 800 can have one or more portions which will each become a light emitting device 1. Here, the intermediate body 800 will be explained based on the enlarged views of a portion thereof.

As shown in FIG. 6A, the intermediate body 800 is held together by the leads 111 and the first walls 300 which are parts of the bottom parts 100. The bottom parts 100 of the intermediate bodies 800 are arranged in the x direction and the y direction.

The intermediate body 800 includes light emitting elements 21, 22, and 23. Similar to the description with reference to the light emitting device 1, the light emitting elements 21, 22, and 23 might occasionally be described collectively as light emitting elements 20. As shown in FIG. 6B, the light emitting elements 21, 22, and 23 are arranged on the upper face of the bottom parts 100 along the x direction.

Before or after the step of providing an intermediate body 800, a step of forming a frame F1 that surrounds the intermediate body 800 can be conducted. The frame F1 is disposed around the intermediate body 800 or on the peripheral portion of the upper face of the intermediate body 800. As shown in FIG. 6A, the frame F1 is disposed to surround multiple sets of light emitting elements, each set including light emitting elements 21, 22, and 23 arranged in the x direction. The frame F1 can be disposed to surround multiple sets of light emitting elements arranged in the y direction, or surround individual sets. When disposing the light transmissive member 500 described later, the frame F1 can dam the uncured material of the light transmissive member 500. The frame F1 can be formed, for example, by drawing a frame with a material on the flat-shaped intermediate body 800 and hardening the material. Alternatively, a frame-shaped or bar-shaped formed material can be bonded onto the intermediate body 800 by using a bonding material or the like. Examples of materials for the frame F1 include a silicone resin. The frame F1 will be removed in the step S30 of forming a first groove or the step S42 of forming a second groove described later. The frame F1 is not shown from FIG. 7A onwards.

Disposing Light Transmissive Member

A step S20 of disposing a light transmissive member will be explained based primarily on FIG. 7A and FIG. 7B. The step S20 of disposing a light transmissive member is a step of disposing a light transmissive member 500 on the upper face of the intermediate body 800. The light transmissive member 500 is disposed to cover the light emitting elements 20. The light transmissive member 500 is preferably disposed to further cover the upper faces of the bottom parts 100 and the inner lateral faces 301 of the first wall 300. The light transmissive member 500 can be disposed to cover the upper face of the first wall 300 or just the upper face of the bottom part 100 and the inner lateral faces 301 of the first wall 300.

The height of light transmissive member 500 being disposed can be larger than the height of the upper faces of the first wall 300. The height of the light transmissive member 500 being disposed can be the same as the height of the light transmissive member 50 in each light emitting device 1. In this case, a step of exposing the upper face of the light transmissive member 500 can be omitted. The height of the light transmissive member 500 being disposed can be larger than the height of the light transmissive member 50 in each light emitting device 1.

The light transmissive member 500 is formed by disposing an uncured light transmissive member 500 which is then hardened. The material for the light transmissive member 500 before hardening is in a liquid or paste form. The light transmissive member 500 before being hardened can be applied, for example, by printing, potting, spraying, or the like. The material for the light transmissive material member 500 before being hardened can be disposed in one application. This can simplify the manufacturing process. The material for the light transmissive material member 500 before being hardened can be disposed in multiple applications. This can reduce the generation of air bubbles. For example, FIG. 7A and FIG. 7B show the disposition of the uncured material for the light transmissive member 500 in two applications. First, as shown in FIG. 7A, the light transmissive member 500 is applied from the upper face of the bottom part 100 to around the upper face of the first wall 300. Then as shown in FIG. 7B, the light transmissive member 500 is applied to the position that is higher than the upper face of the first wall 300. In FIG. 7B, the border between the light transmissive member 500 applied in FIG. 7A and the light transmissive member 500 applied in FIG. 7B is indicated by a dotted line.

The light transmissive member 500 thus applied can be hardened at once or on multiple occasions. In one example, the light transmissive member 500 is disposed in the first round of application, followed by the second round of application, and then hardened at once after the second application. The light transmissive member 500 can be hardened after the first round of application before the second round of application.

Forming First Groove

A step S30 of forming a first groove will be explained based primarily on FIG. 7C. The step S30 of forming a first groove is a step of forming a first groove 71 in the light transmissive member 500. The first groove 71 is formed by partially removing the light transmissive member 500 to expose at least a portion of the upper face of the first wall 300. When forming a first groove 71, a portion of the upper face of the first wall 300 can be removed together. In this case, the exposed face of the first wall 300 as a result of forming the first groove 71 can be different from the face before forming the first groove 71, but such a face is also referred to as the upper face of the first wall 300.

A first groove 71 is formed along a lengthwise direction of the upper face of the first wall 300 to be exposed. The center of the first groove 71 preferably coincides with the center of the upper face of the first wall 300 in the cross section that is orthogonal to the lengthwise direction of the first groove 71. In a cross section, the length of the first groove 71 in the x direction is preferably substantially the same as the length of the upper face of the first wall 300 in the x direction. The length of the first groove 71 in the x direction can be smaller than the length of the upper face of the first wall 300. This can allow the light transmissive member 500 to be partially placed on the upper face of the first wall 300 in the x direction. This can also expose a portion of the upper face of the first wall 300 from the second wall 400 which will be formed in the subsequent step. The bottom face that defines the first groove 71 is the upper face of the first wall 300. The lateral faces that define the first groove 71 are the faces of the light transmissive member 500.

A first groove 71 can be formed by using a blade. For the step S30 of forming a first groove, a blade that is 100 μm to 900 μm in thickness can be used. A first groove 71 is preferably formed by using a flat tipped blade. This can form a first groove 71 that is perpendicular to the bottom part 100. A first groove 71 can be formed by laser processing or the like.

Forming Second Wall

A step S40 of forming a second wall will be explained based primarily on FIG. 7D to FIG. 7H. The step S40 of forming a second wall is a step of forming a second wall 400 by disposing a first resin 410 in a first groove 71. The step S40 of forming a second wall includes a step S41 of disposing a second resin in a first groove 71, a step S42 of forming a second groove by partially removing the second resin 420 along the first groove 71 to expose the upper face of the first wall 300 in a smaller width than the first groove 71 in a plan view, and a step S43 of disposing a first resin in the second groove 72.

The step S41 of disposing a second resin will be explained based primarily on FIG. 7D. The step S41 of disposing a second resin is a step of disposing a second resin 420 in a first groove 71. The second resin 420 is disposed to cover at least the upper face of the first wall 300 and the lateral faces of the light transmissive member 500 that are exposed as a result of forming a first groove 71. The second resin 420 can be disposed to cover the upper face of the light transmissive member 500. In this case, the step of exposing the upper face of the light transmissive member 500 described later is included. This can reduce the height variations of the light transmissive member 500. The second resin 420 can be disposed only on the inside of a first groove 71.

The second resin 420 can be disposed such that the height thereof is larger than the height of the upper face of the light transmissive member 500. The height of the second resin

420 can be the same as the height of the upper face of the light transmissive member 500.

The second resin 420 is, for example, a resin having light reflectivity. The second resin 420 is formed by disposing and hardening un uncured second resin 420. The second resin 420 is disposed by a method such as potting or spraying.

The step S42 of forming a second groove will be explained based primarily on FIG. 7E and FIG. 7F. The step S42 of forming a second groove is a step of forming a second groove 72 in the second resin 420. In the step S42, a second groove 72 can be formed at once or in multiple applications. For example, the second grooves 72 shown in FIG. 7E and FIG. 7F are formed in two separate applications.

Figure 7E:
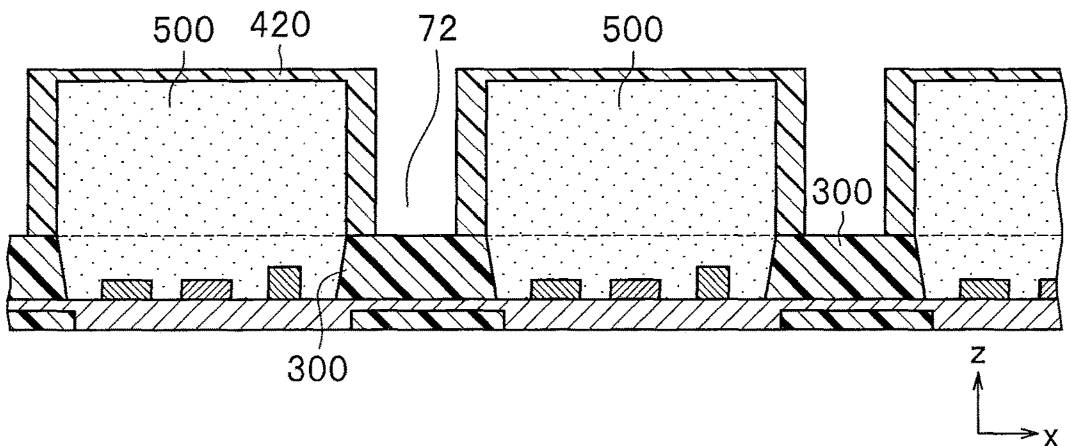
FIG. 7E is a schematic cross-sectional view illustrating the method of manufacturing a light emitting device according to the first embodiment.

As shown in FIG. 7E, the step S42 of forming a second groove includes a first step of exposing the upper face of the first wall 300 at least in part by removing a portion of the second resin 420. When partially removing the second resin 420, the upper face of the first wall 300 can be removed together in part. In this case, the face of the first wall 300 exposed as a result of removing the second resin 420 can be different from the upper face of the first wall 300 before forming the second groove 72, but such a face is also referred to as the upper face of the first wall 300. In the first step, a second groove 72 is formed along the lengthwise direction of the first wall 300 to be exposed. The center of a second groove 72 preferably coincides with the center of the upper face of the first wall 300 in the cross section that is orthogonal to the lengthwise direction of the second groove 72. The center of the second groove 72 preferably coincides with the center of the first groove 71. As shown in FIG. 7E, the second grooves 72 are formed such that their width is smaller than that of a first groove 71. The bottom face that defines a second groove 72 is the upper face of the first wall 300. The lateral faces that define a second groove 72 are the faces of the second resin 420.

Figure 7F:
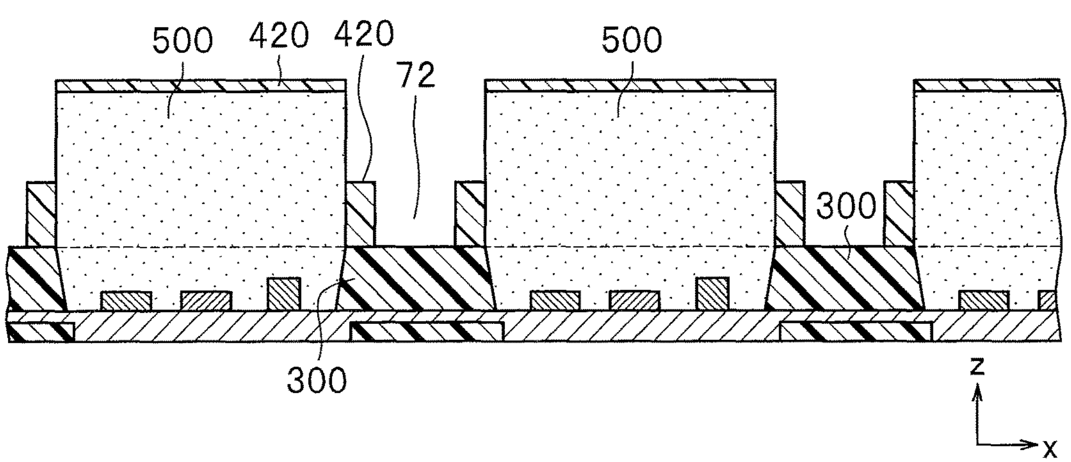
FIG. 7F is a schematic cross-sectional view illustrating the method of manufacturing a light emitting device according to the first embodiment.

As shown in FIG. 7F, the step S42 of forming a second groove can include a second step of partially exposing the lateral faces of the light transmissive member 500 following the first step. The second step is a step of removing the upper portions of the second resin 420 that cover the lateral faces of the light transmissive member 500. This partly exposes the lateral faces of the light transmissive member 500 from the second resin 420. When forming a second groove 72, the lateral faces of the light transmissive member 500 can be partly removed together. In this case, the faces of the light transmissive member 500 exposed as a result of forming a second groove 72 can be different from the lateral faces prior to forming the second groove 72, but such faces are also referred to as the lateral faces of the light transmissive member 500. The width of a second groove formed in the first step is smaller than the width of a first groove 71. Having a first step and a second step, the step S42 of forming a second groove can adjust the width and the height of the second resin 420 of the second wall 400, respectively. In this manner, a light emitting device 1 having the properties as desired can be manufactured. The first step can be conducted after conducting the second step.

A second groove 72 can be formed by using a method the same as or a similar to that for forming a first groove 71. In the first step, for example, a blade that is in a range of 100 to 600 in thickness can be used. In the second step, for example, a blade that is in a range of 100 to 900 in thickness can be used. The shape of the blade used in the first step can be the same as or different from the shape of the blade used in the second step. For example, a blade with a flat tip is preferably used in both the first step and the second step. This can form a second groove 72 that is orthogonal to the bottom part 100. The width of the light reflecting part 42 in a light emitting device 1 can be adjusted by adjusting the thickness of the blade used in forming the second grooves 72.

Figure 7G:
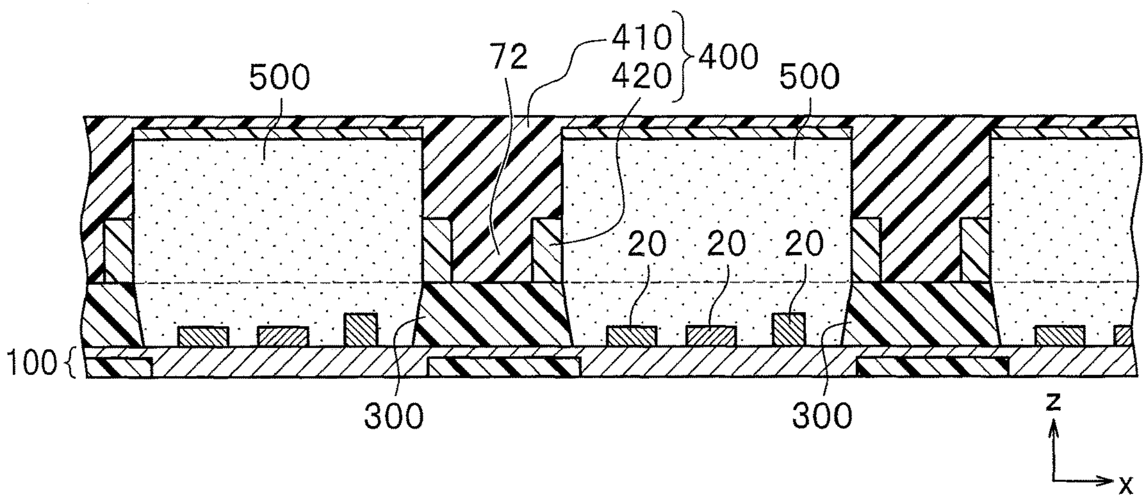
FIG. 7G is a schematic cross-sectional view illustrating the method of manufacturing a light emitting device according to the first embodiment.

The step S43 of disposing a first resin will be explained based primarily on FIG. 7G. The step S43 of disposing a first resin is a step of disposing a first resin 410 in a second groove 72. In the S43 of disposing a first resin, a second wall 400 is formed by disposing a first resin 410 in a second groove 72. The second wall 400 is the part that becomes the second wall 40 in a light emitting device 1. The first resin 410 is disposed to cover at least the upper face of the first wall 300, the upper face of the second resin 420, the lateral faces of the second resin 420, and the lateral faces of the light transmissive member 500 that are exposed as a result of forming a second groove 72. The first resin 410 can be disposed to cover the upper face of the light transmissive member 500. In this case, the step of exposing the upper face of the light transmissive member 500 described later is included. This can reduce the height variations of the light transmissive member 500. The first resin 410 can be disposed only on the inside of a second groove 72. In the case in which the first resin 410 covers the light transmissive member 500, it covers the light transmission member 500 via the second resin 420 disposed on the upper face of the light transmissive member 500.

The first resin 410 can be disposed to be higher than the height of the upper face of the light transmissive member 500. In this case, the step of aligning the height of the upper face of the first resin 410 with the height of the upper face of the light transmissive member 500 or the step of exposing the upper face of the light transmissive member 500 described later is included. The height of the first resin 410 being disposed can be the same as the height of the upper face of the light transmissive member 500. The height of the first resin 410 being disposed can be the same as the height of the upper face of the second resin 420 that covers the upper face of light transmissive member 500.

The first resin is, for example, a resin having a light shielding property. The first resin 410 is formed by disposing and hardening an uncured first resin 410. The first resin 410 can be formed by using the same method as that for the second resin 420 or a different method.

Figures 7H, 7I:
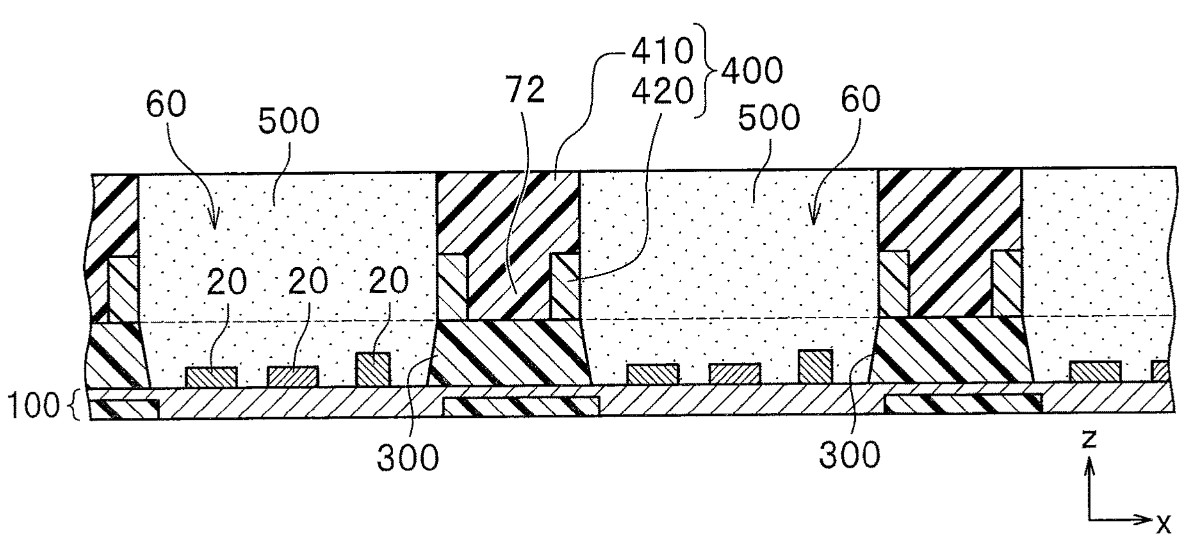
FIG. 7H is a schematic cross-sectional view illustrating the method of manufacturing a light emitting device according to the first embodiment.
FIG. 7I is a schematic cross-sectional view illustrating the method of manufacturing a light emitting device according to the first embodiment.

A step of exposing the upper face of the light transmissive member 500 will be explained based primarily on FIG. 7H. The step of exposing the upper face of the light transmissive member 500 can be conducted after the step S40 of forming a second wall. The upper face of the light transmissive member 500 is exposed by removing the first resin 410 and the second resin 420. Here, because the second resin 420 and the first resin 410 are disposed on the upper face of the light transmissive member 500, these are removed together with a portion of the upper face of the light transmissive member 500. The upper face of the light transmissive member 500 after the removal becomes the emission faces of the light emitting devices subsequent to dividing the intermediate body into individual devices. The upper face of the light transmissive member 500 might be exposed after forming the second wall 400 in some cases. In such a case, a step of aligning the height of the upper face of the already exposed light transmissive member 500 with the upper face of the second wall 400 can be conducted in place of the step of exposing the upper face of the light transmissive member 500.

In the step of exposing the upper face of the light transmissive member 500, for example, the first resin 410 and the second resin 420 disposed on the upper face of the light transmissive member 500 are polished after forming the second wall 400 to expose the upper face of the light transmissive member 500. Polishing creates protrusions and depressions on the upper face of the light transmissive member 500, thereby producing a light emitting device 1 with reduced scattering of external light at the upper face of the light transmissive member 500. For example, a polishing paper, buffing compound, diamond grinding stone, or the like is used in polishing the upper face of the light transmissive member 500.

Cutting into Individual Device/Cutting Second Wall

A step S50 of cutting into individual device will be explained based primarily on FIG. 7I. The step S50 of cutting into individual device is a step of cutting the work-in-process into individual light emitting device 1. In the case in which the intermediate body 800 includes multiple portions that will become light emitting devices 1, the step S50 of cutting into individual device produces multiple light emitting devices 1 each including lateral walls constituted of a first wall 30 and a second wall 40, and a light transmissive member 50 disposed in the cavity 60 defined by the first wall 30, the second wall 40, and the bottom part 10. The step S50 of cutting into individual device can be omitted in the case in which the intermediate body 800 includes a single portion that becomes a light emitting device 1.

The step S50 of cutting into individual device cuts the work-in process along the lengthwise direction of the first grooves 71 or the second grooves 72. The step S50 of cutting into individual device preferably cuts at the center of each first groove 71 or second groove 72 in the cross section that is orthogonal to the lengthwise direction of the first groove 71 or the second groove 72. The step S50 of cutting into individual devices cuts the second wall 400, the first wall 300, and the bottom part 100.

Examples of methods of cutting into individual device include dicing, die cutting, Thomson type punching, ultrasonic machining, laser beam machining, and the like.

The method of manufacturing a light emitting device 1 can reduce the warping of the base 15. In the case of forming a first wall 300 and a second wall 400 all at once by using a mold or the like, the wall having the height which combines the first wall 300 and the second wall 400 is formed all at once. Thus, the base 15 can easily warp. In contrast, the method of manufacturing a light emitting device 1 can reduce the warping of the base 15 because the second wall 400 is formed on the first wall 300 in a separate step.

The method of manufacturing a light emitting device 1 can manufacture a light emitting device 1 with high light extraction and a small outer shape in a plan view. In the case of forming a first wall 300 and a second wall 400 all at once by using a mold or the like, forming a wall having the oblique inner lateral faces like those of the first wall 300 shown in FIG. 6B would increase the outer shape in a plan view. In contrast, the method of manufacturing a light emitting device 1 forms the first wall 300 and the second wall 400 in separate steps. Accordingly, the inner lateral faces of the first wall 300 can be formed to be oblique in order to readily reflect the light from the light emitting elements, and the inner lateral faces of the second wall 400 can be formed to be practically perpendicular to the lower face of the light emitting device 1 so as not to increase the outer shape in a plan view. Thus, the method can manufacture a light emitting device 1 with high light extraction without increasing the plan view outer shape.

The method of manufacturing a light emitting device 1 simplifies the mounting of a light emitting element 20. The inner lateral faces of a second wall 400 of the light emitting device 1 are practically perpendicular to the lower face of the light emitting device 1. Thus, the tool for mounting a light emitting element 20 would easily come into contact with the inner lateral faces of the second wall 400. However, the first wall 300 and the second wall 400 are formed in separate steps in the method of manufacturing a light emitting device 1. Accordingly, in the method of manufacturing a light emitting device 1, a light emitting element 20 can be mounted before forming a second wall 400. This can make it easy to mount a light emitting element 20.

According to the method of manufacturing a light emitting device 1, a second wall 400 which combines a light shielding region and a light reflecting region can be formed by using a resin having light reflectivity for the second resin 420 and a resin having a light shielding property for the first resin 410. This can increase the contrast ratio between the lit state and the unlit state.

Method of Manufacturing Light Emitting Device According to Second Embodiment

Figure 9A:
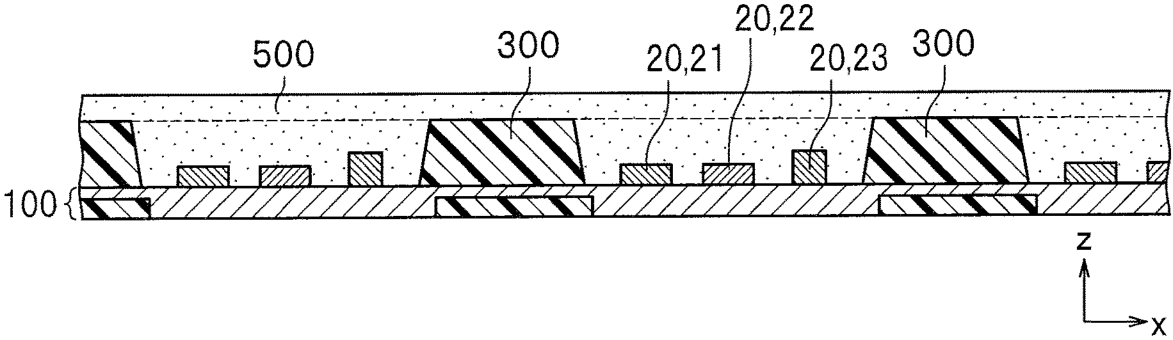
FIG. 9A is a schematic cross-sectional view illustrating a method of manufacturing a light emitting device according to the second embodiment.
Figure 9B:
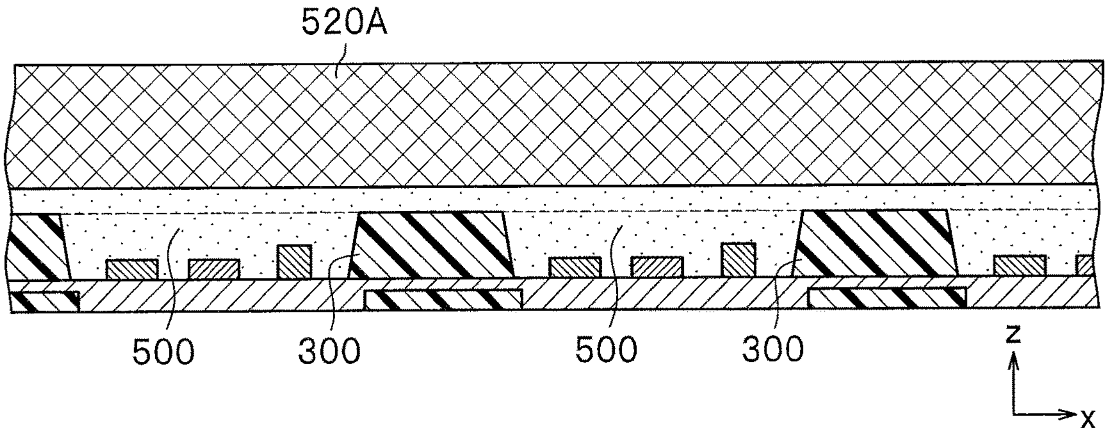
FIG. 9B is a schematic cross-sectional view illustrating the method of manufacturing a light emitting device according to the second embodiment.
Figure 9C:
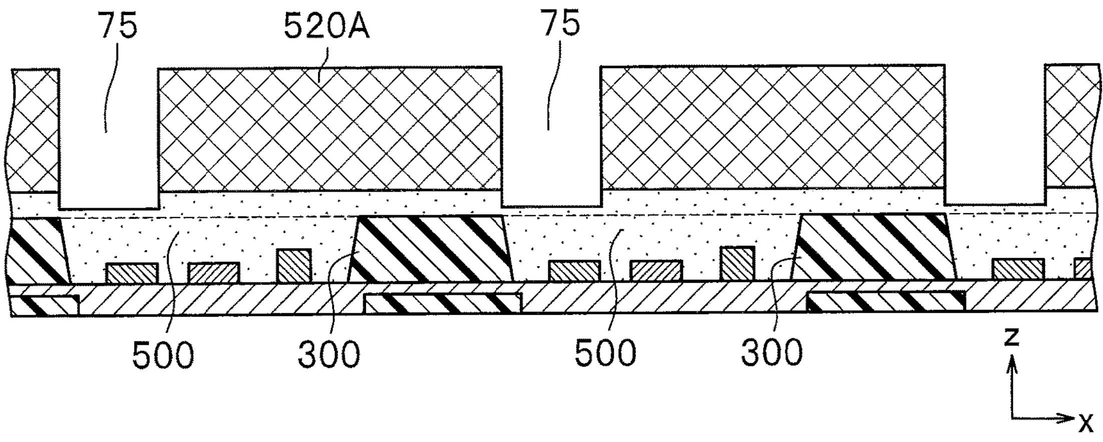
FIG. 9C is a schematic cross-sectional view illustrating the method of manufacturing a light emitting device according to the second embodiment.
Figure 9D:
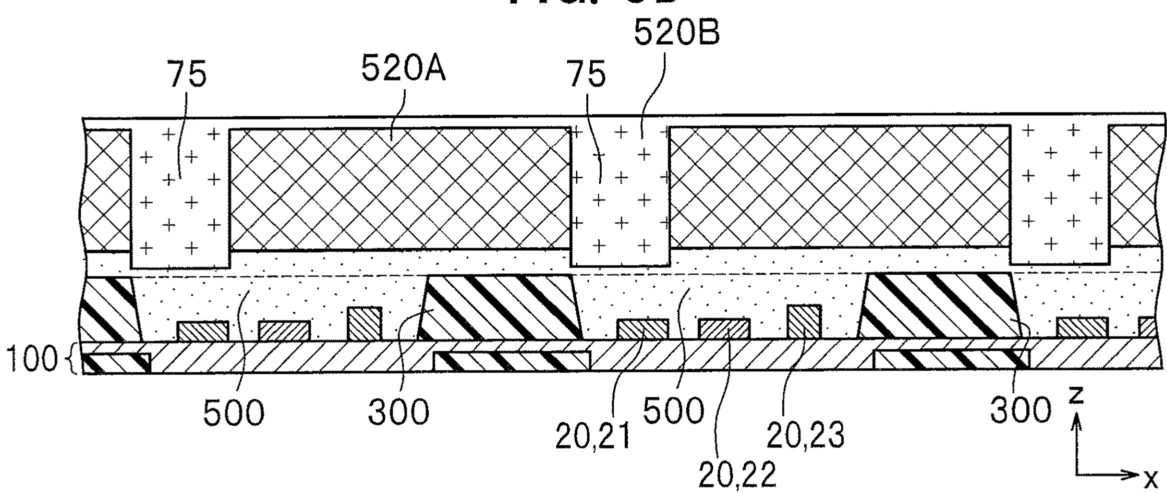
FIG. 9D is a schematic cross-sectional view illustrating the method of manufacturing a light emitting device according to the second embodiment.
Figure 9E:
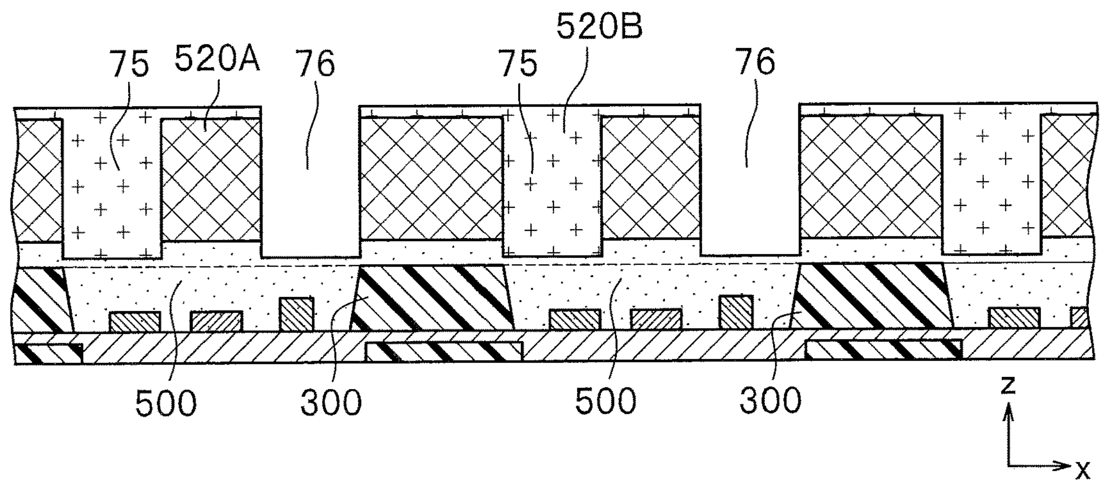
FIG. 9E is a schematic cross-sectional view illustrating the method of manufacturing a light emitting device according to the second embodiment.
Figure 9F:
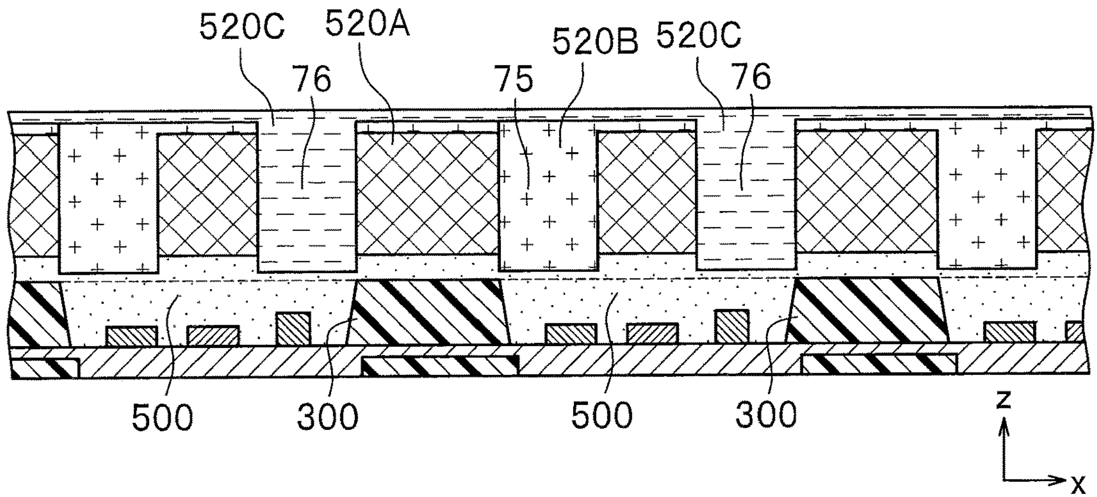
FIG. 9F is a schematic cross-sectional view illustrating the method of manufacturing a light emitting device according to the second embodiment.
Figure 9G:
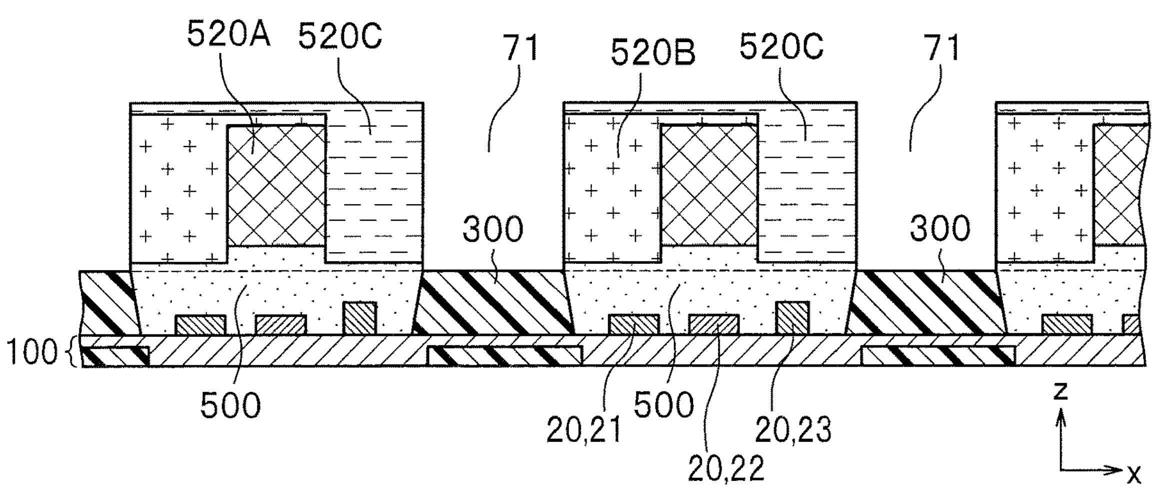
FIG. 9G is a schematic cross-sectional view illustrating the method of manufacturing a light emitting device according to the second embodiment.
Figure 9H:
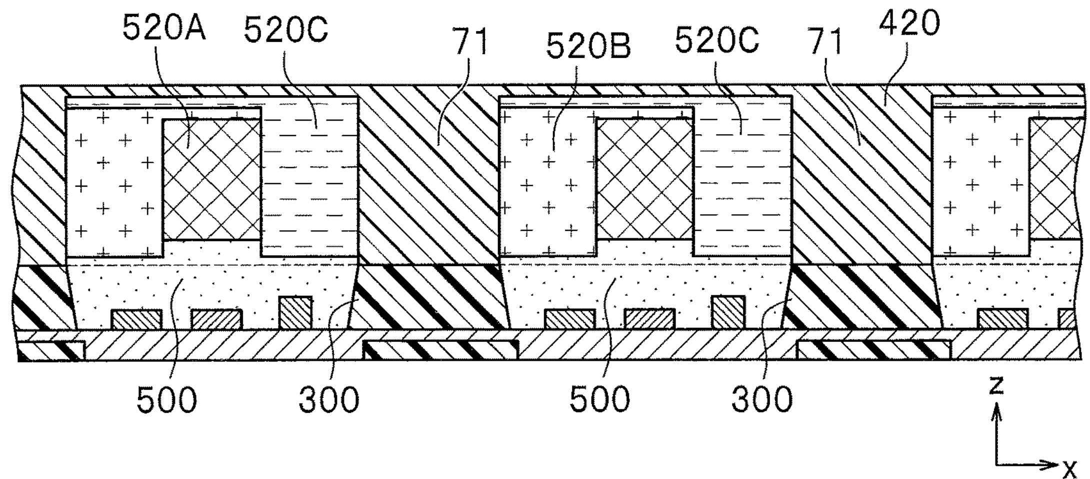
FIG. 9H is a schematic cross-sectional view illustrating the method of manufacturing a light emitting device according to the second embodiment.
Figure 9I:
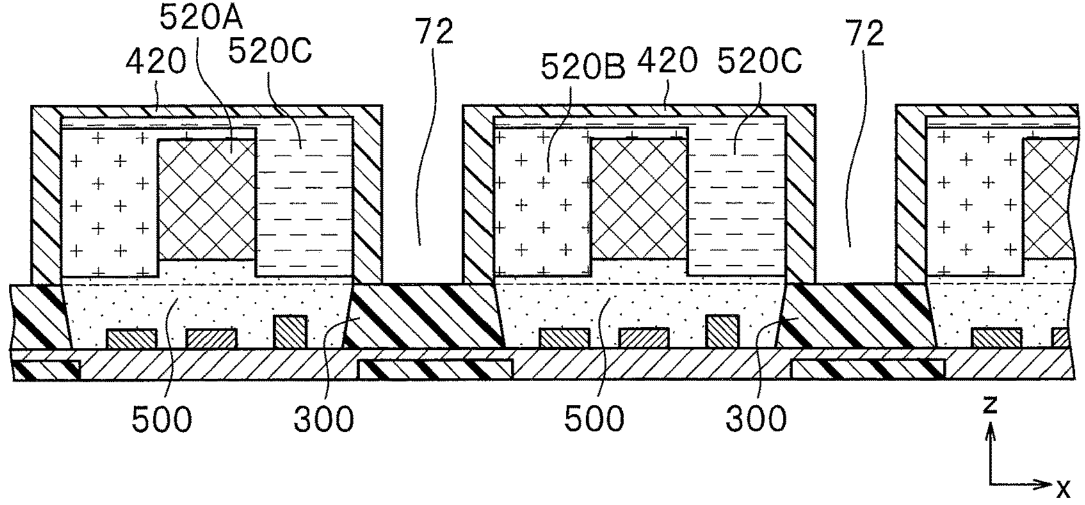
FIG. 9I is a schematic cross-sectional view illustrating the method of manufacturing a light emitting device according to the second embodiment.
Figure 9J:
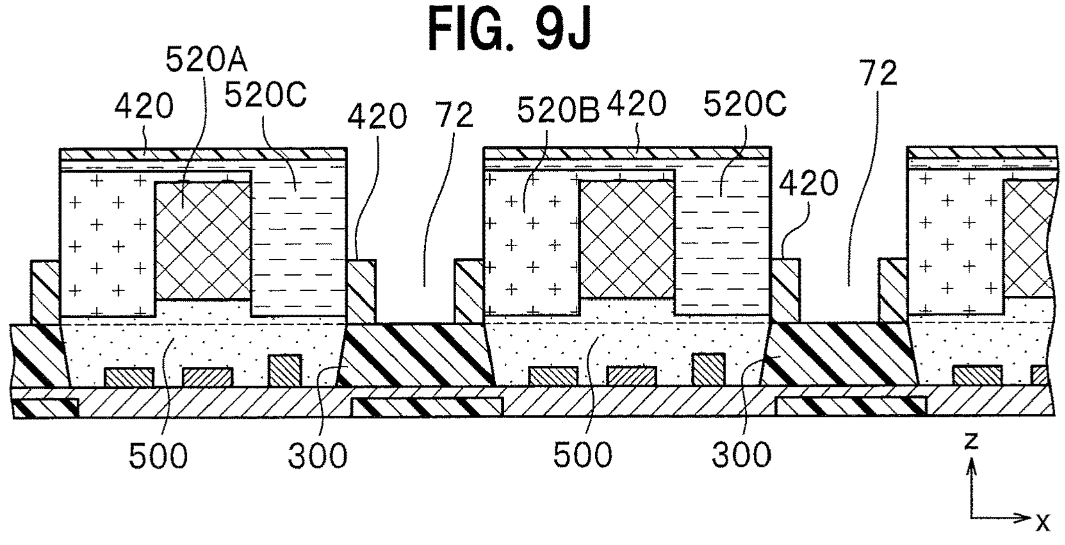
FIG. 9J is a schematic cross-sectional view illustrating the method of manufacturing a light emitting device according to the second embodiment.
Figure 9K:
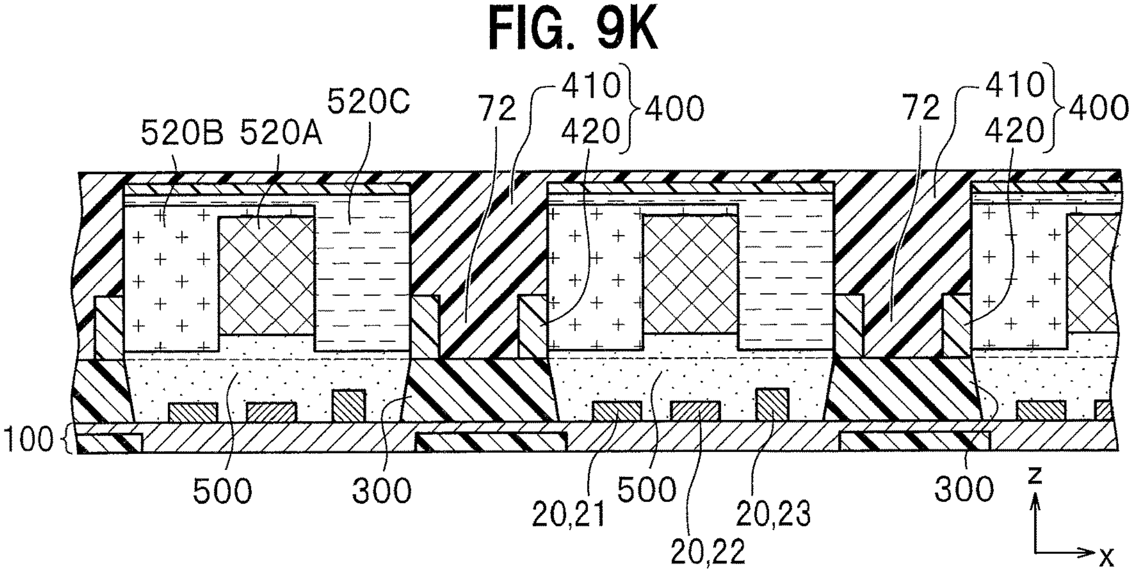
FIG. 9K is a schematic cross-sectional view illustrating the method of manufacturing a light emitting device according to the second embodiment.
Figure 9L:
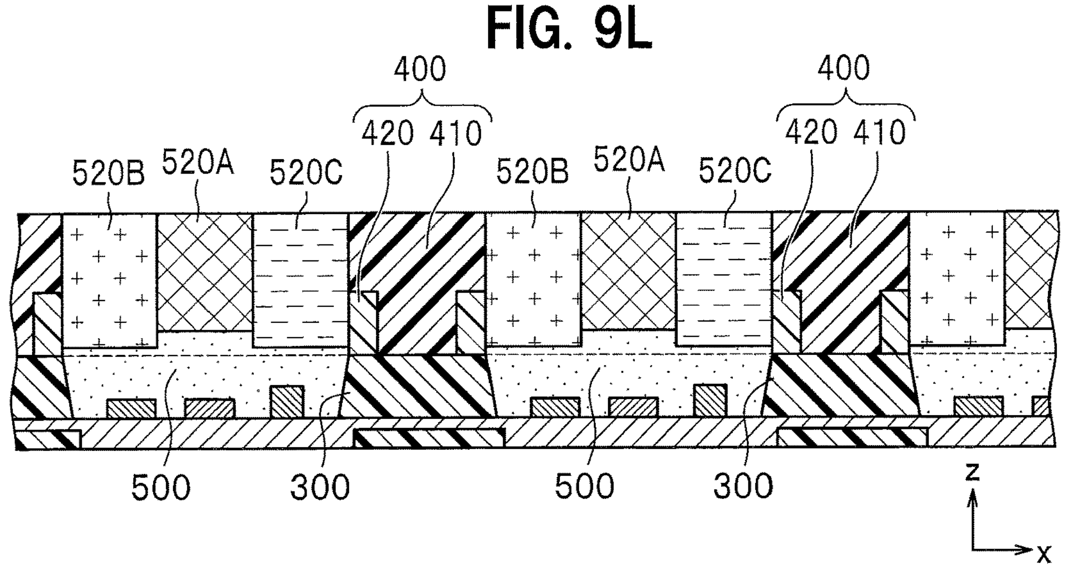
FIG. 9L is a schematic cross-sectional view illustrating the method of manufacturing a light emitting device according to the second embodiment.
Figure 9M:
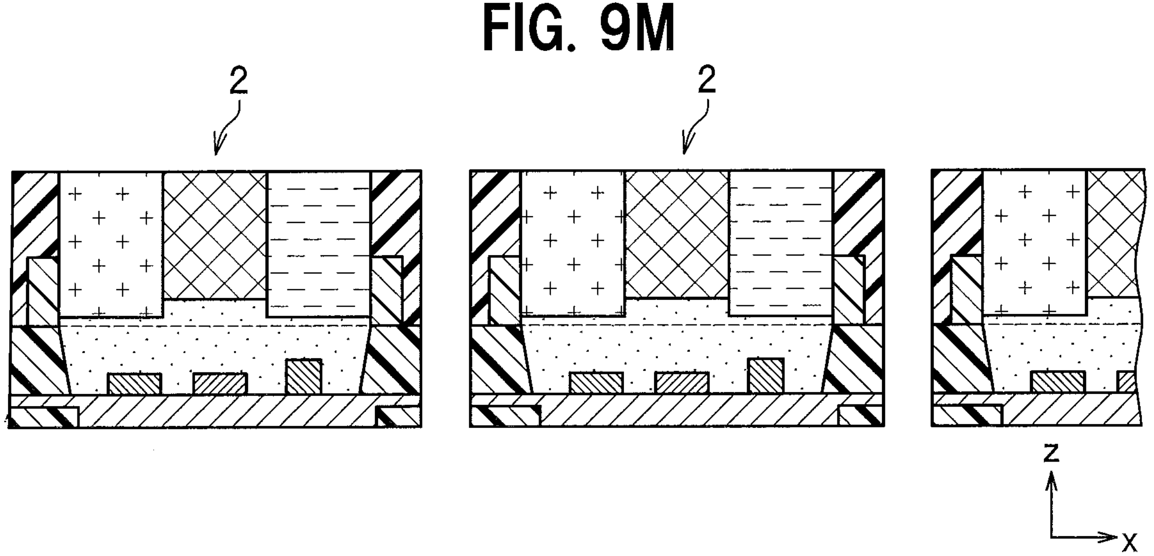
FIG. 9M is a schematic cross-sectional view illustrating the method of manufacturing a light emitting device according to the second embodiment.

A method of manufacturing a light emitting device 2 according to a second embodiment will be explained next with reference to FIG. 8 to FIG. 9M. FIG. 8 is a flowchart of a method of manufacturing the light emitting device. FIG. 9A to FIG. 9M are schematic cross-sectional views illustrating the state in each step.

The method of manufacturing a light emitting device 2 differs from the method of manufacturing the light emitting device 1 by having, subsequent to the step S20 of disposing a light transmissive member, a step S61 of disposing a first colored resin on the light transmissive member 500, a step S62 of exposing a first exposed portion of the light transmissive member 500 by removing a first exposed portion of the first colored resin 520A, a step S63 of disposing a second colored resin on the first exposed portion of the light transmissive member 500, a step S64 of exposing a second exposed portion of the light transmissive member 500 by removing a second exposed portion of the first colored resin 520A, and a step S65 of disposing a third colored resin on the second exposed portion of the light transmissive member 500. The first groove forming step S30 and the remaining steps are conducted subsequent to the step S65 of disposing a third colored resin.

The step S10 of providing an intermediate body is basically consistent with that of the method of manufacturing a light emitting device 1.

A step S20 of disposing a light transmissive member according to the method of manufacturing a light emitting device 2 will be explained based on FIG. 9A. The step S20 of disposing a light transmissive member is basically consistent with that of the method of manufacturing a light emitting device 1. The steps described below will dispose a material containing a coloring agent on the upper face of the light transmissive member 500. For this reason, the light transmissive member 500 is preferably disposed to the height that equals one half of the height of the light emitting device 2 or smaller.

Disposing First Colored Resin

A step S61 of disposing a first colored resin will be explained based primarily on FIG. 9B. The step S61 of disposing a first colored resin is a step of disposing a first colored resin 520A on the light transmissive member 500. The height of the first colored resin 520A being disposed is preferably larger than the height of the upper part 52A which will result when the light emitting device 2 is completed. In the cross-sectional view, the first colored resin 520A is disposed to cover at least the area of the upper face of the light transmissive member 500 located above the light emitting elements 20. The first colored resin 520A can cover the entire upper face of the light transmissive member 500. The step S61 of disposing a first colored resin is a step of placing and hardening a material for the first colored resin 520A that contains a first coloring agent. Alternatively, a sheet or block shaped formed resin containing a coloring agent can be bonded to the upper face of the light transmissive member 500 using a bonding material.

Exposing One Portion of Light Transmissive Member

A step S62 of exposing a portion of light transmissive member will be explained based primarily on FIG. 9C. The step S62 of exposing a portion of the light transmissive member is a step of removing a portion of the first colored resin 520A thereby exposing a portion of the light transmissive member 500. A first portion 75 is a groove resulting from removing a portion of the first colored resin 520A. A first portion 75 is formed to expose the upper face of the light transmissive member 500. When forming a first portion 75, a portion of the light transmissive member 500 can be removed together. In this case, the upper face of the light transmissive member 500 exposed by forming a first portion 75 can be a different face from the upper face of the light transmissive member 500 prior to forming the first portion 75, but such a face is also referred to as the upper face of the light transmissive member 500.

The step S62 of exposing a portion of the light transmissive member preferably removes the first colored resin 520A to a position that is lower than the interface between the lower face of the first colored resin 520A and the upper face of the light transmissive member 500. In this manner, the colored resin which will be disposed in the step described below can be disposed on the upper face of the light transmissive member 500 without interposing the first colored resin 520A. The step S62 of exposing a portion of the light transmissive member preferably exposes the light transmissive member 500, i.e., a face defining the bottom of the first portion 75, at a higher position than the upper face of the first wall 300. This can suppress the first wall 300 from being partially removed together with the first colored resin 520A when forming a first portion 75.

In a plan view, a first portion 75 is formed in a region that is not the central region when the a region between two first walls 300 is divided into three equal parts in the direction in which the light emitting elements 20 are arranged. The first portion 75 overlaps one of the light emitting elements 20 via the light transmissive member 500 in a plan view.

A first portion 75 can be formed by a method the same or similar to that for forming a first groove 71. A first portion 75 is formed, for example, by using a blade that is 100 μm to 600 μm in thickness. The shape of the blade used in forming a first portion 75 has a flat tip, for example.

Disposing Second Colored Resin

A step S63 of disposing a second colored resin will be explained based primarily on FIG. 9D. The step S63 of disposing a second colored resin is a step of disposing a second colored resin 520B in a first portion 75. The second colored resin 520B is disposed to cover at least the upper face of the light transmissive member 500 exposed as a result of forming a first portion 75. The second colored resin 520B is disposed to cover the lateral faces of the light transmissive member 500 and the lateral faces of the first colored resin 520A that are exposed as a result of forming a first portion 75. The second colored resin 520B can be disposed to cover the upper face of the first colored resin 520A. In this case, the step of exposing the upper face of the first colored resin 520A described later is included. This can reduce the height variations among the first colored resin 520A, the second colored resin 520B, and the third colored resin 520C. The second colored re sin 520B can be disposed only inside a first portion 75.

The second colored resin 520B can be disposed to a height that is higher than the upper face of the first colored resin 520A. In this case, a step of aligning the height of the upper face of the first colored resin 520A with the height of the upper face of the second wall 400 or the step of exposing the upper face of the first colored resin 520A is included. The height of the second colored resin 520B being disposed can be the same as the height of the upper face of the first colored resin 520A. In this case, the step of exposing the upper face of the first colored resin 520A can be omitted.

The step S63 of disposing a second colored resin can employ the same as or a similar method to that used in the step S61 of disposing a first colored resin. The second colored resin 520B contains a second coloring agent.

Exposing Another Portion of Light Transmissive Member

A step S64 of exposing another portion of the light transmissive member will be explained based primarily on FIG. 9E. The step S64 of exposing another portion of the light transmissive member is a step of removing another portion of the first colored resin 520A thereby exposing another portion of the light transmissive member 500. The step S64 of exposing another portion of the light transmissive member is basically the same as the step S62 of exposing a portion of the light transmissive member. A second portion 76 is a groove formed as a result of removing a portion of the first colored resin 520A. A second portion 76 is formed to expose the upper face of the light transmissive member 500. A portion of the upper face of the light transmissive member 500 can be removed together when forming a second portion 76. In this case, the upper face of the light transmissive member 500 exposed as a result of forming a second portion 76 can be a different face from the upper face of the light transmissive member 500 prior to forming the second portion 76, but such a face is also referred to as the upper face of the light transmissive member 500. In the case in which the second colored resin 520B covers the upper face of the first colored resin 520A, a portion of the second colored resin 520B covering a portion of the first colored resin 520A to be removed is also removed when forming a second portion 76.

In the step S64 of exposing another portion of the light transmissive member, the first colored resin 520A is preferably removed to a position that is lower than the interface between the lower face of the first colored resin 520A and the upper face of the light transmissive member 500 in the cross-sectional view. In the cross section, the face defining the bottom of the first portion 75 and a face defining the bottom of the second portion 76 can have the same height or different heights.

In a plan view, a second portion 76 is formed in the other region that is not the central region when the region between two first walls 300 is divided into three equal parts in the direction in which the light emitting elements 20 are arranged. A second portion 76 overlaps one of the light emitting elements 20 in a plan view.

A second portion 76 can be formed by using a method the same or a similar to that for forming a first groove 71. A second portion 76 is preferably formed by using the same blade as that used for a first portion 75.

Disposing Third Colored Resin

A step S65 of disposing a third colored resin will be explained based primarily on FIG. 9F. The step S65 of disposing a third colored resin is a step of disposing a third colored resin 520C in the second portion 76. The third colored resin 520C is disposed to cover at least the upper face of the light transmissive member 500 exposed as a result of forming the second portion 76. The third colored resin 520C is disposed to cover the lateral faces of the light transmissive member 500 and the lateral faces of the first colored resin 520A that are exposed as a result of forming the second portion 76. The third colored resin 520C can be disposed to cover the upper face of the second colored resin 520B. In this case, the step of exposing the upper face of the first colored resin 520A described later is included. This can reduce the height variations among the first colored resin 520A, the second colored resin 520B, and the third colored resin 520C. The third colored resin 520C can be disposed only on the inside of a second portion 76.

The height of the third colored resin 520C being disposed can be larger than the height of the upper face of the first colored resin 520A. The height of the third colored resin 520C being disposed can be larger than the height of the upper face of the second colored resin 520B disposed on the upper face of the first colored resin 520A. The height of the third colored resin 520C being disposed can be the same as the height of the upper face of the second colored resin 520B. In the case in which the third colored resin 520C is higher than the upper face of the first colored resin 520A, a step of aligning the height of the upper face of the first colored resin 520A with the height of the second wall 400 or the step of exposing the upper face of the first colored resin 520A is included. The height of the third colored resin 520C can be the same as the height of the upper face of the first colored resin 520A. In this case, the step of exposing the upper face of the first colored resin 520A can be omitted.

The step S65 of disposing the third colored resin can be conducted by using a method the same as or a similar to that used in the step S61 of disposing a first colored resin. The third colored resin 520C contains a third coloring agent.

In the cross-sectional view subsequent to the step S65 of disposing a third colored resin, the first colored resin 520A is located between the second colored resin 520B and the third colored resin 520C. The lower face of the first colored resin 520A is positioned higher than the lower face of the second colored resin 520B and the lower face of the third colored resin 520C.

Here, as an example, the first colored resin 520A is green, the second colored resin 520B is blue, and the third colored resin 520C is red. The second colored resin 520B which is blue, the first colored resin 520A which is green, and the third colored resin 520C which is red are formed above the light emitting element 21 which emits blue light, the light emitting element 22 which emits green light, and the light emitting element 23 which emits red light, respectively. The first colored resin 520A which is green disposed first on the light transmissive member 500 is formed at a location that is interposed between the second colored resin 520B which is blue and the third colored resin 520C which is red.

The steps from the first groove forming step S30 onwards are basically consistent with the method of manufacturing a light emitting device 1. In the following paragraphs, only the aspects that differ from the method of manufacturing a light emitting device 1 will be explained. In the following paragraphs, furthermore, the example in which the second colored resin 520B and the third colored resin 520C are stacked on the upper face of the first colored resin 520A shown in FIG. 9G will be explained. The third colored resin 520C constitutes the upper face of the first to third colored resins 520A to 520C stacked on the light transmissive member 500.

Forming First Groove

A step S30 of forming a first groove will be explained based primarily on FIG. 9G. The method of manufacturing a light emitting device 2 differs from the method of manufacturing a light emitting device 1 such that the first colored resin 520A, the second colored resin 520B, and the third colored resin 520C disposed on the upper face of the light transmissive member 500 are removed together with the light transmissive member 500.

Forming Second Wall

A step S41 of disposing a second resin will be explained based primarily on FIG. 9H. The method of manufacturing a light emitting device 2 differs from the method of manufacturing a light emitting device 1 such that the second resin 420 is disposed to cover at least the upper face of the first wall 300, the lateral faces of the light transmissive member 500, the lateral faces of the second colored resin 520B, and the lateral faces of the third colored resin 520C that are exposed as a result of forming a first groove 71, and to cover the lateral faces of the first colored resin 520A. In the example shown in FIG. 9H, the second resin 420 is disposed to cover the upper face of the third colored resin 520C.

A step S42 of forming a second groove will be explained based primarily on FIG. 9I and FIG. 9J. The method of manufacturing a light emitting device 2 differs from the method of manufacturing a light emitting device 1 such that the upper portions of the second resin 420 that covers the lateral faces of the first colored resin 520A, the lateral faces of the second colored resin 520B, and the lateral faces of the third colored resin 520C are removed.

A step S43 of disposing a first resin will be explained based primarily on FIG. 9K. The method of manufacturing a light emitting device 2 differs from the method of manufacturing a light emitting device 1 such that the first resin 410 is disposed to cover at least the upper face of the first wall 300, the upper face of the second resin 420, the lateral faces of the second resin 420, the lateral faces of the light transmissive member 500, the lateral faces of the second colored resin 520B, and the lateral faces of the third colored resin 520C that are exposed as a result of forming a second groove 72, and to cover the lateral faces of the first colored resin 520A. In the example shown in FIG. 9K, the first resin 410 is disposed to cover the upper face of the third colored resin 520C via the second resin 420. The third colored resin 520C is disposed to cover the upper face of the second colored resin 520B. Furthermore, the third colored resin 520C is disposed to cover the upper face of the first colored resin 520A via the second colored resin 520B.

A step of exposing the upper face of the first colored resin 520A will be explained based primarily on FIG. 9L. The method of manufacturing a light emitting device 2 differs from the method of manufacturing a light emitting device 1 by including a step of exposing the upper face of the first colored resin 520A subsequent to the step S40 of forming a second wall. The upper face of the first colored resin 520A is exposed by removing the second colored resin 520B, the third colored resin 520C, the second resin 420, and the first resin 410 disposed on the upper face of the first colored resin 520A. This also exposes the upper face of the second colored resin 520B and the upper face of the third colored resin 520C. Furthermore, in the example shown in FIG. 9L, a portion of the upper face of the first colored resin 520A is also removed at the top.

The method of manufacturing a light emitting device 2 can provide a light emitting device with improved contrast ratio between the lit state and the unlit state. This is because, in the method of manufacturing a light emitting device 2, a second wall 400 is formed after forming the first colored resin 520A, the second colored resin 520B, and the third colored resin 520C, which allows for the formation of the regions containing coloring agents above the light emitting elements 20.

The method of manufacturing a light emitting device 2 can provide a light emitting device having a wide light distribution. The method of manufacturing a light emitting device 2 incudes a step of exposing the upper face of the first colored resin 520A after forming a second wall 400. This can match the height of the emission face of the light emitting device 2 which is composed of the first colored resin 520A, the second colored resin 520B, and the third colored resin 520C with the height of the upper face of the second wall 400. This can provide a light emitting device having a wide light distribution.

Method of Manufacturing Light Emitting Device Variation

Figure 10A:
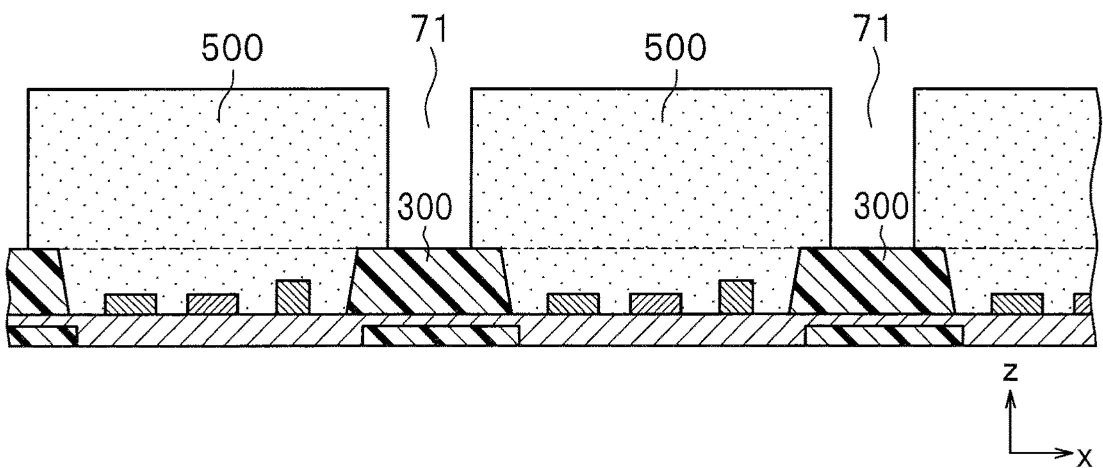
FIG. 10A is a schematic cross-sectional view of a method of manufacturing a light emitting device having a second wall variation.
Figure 10B:
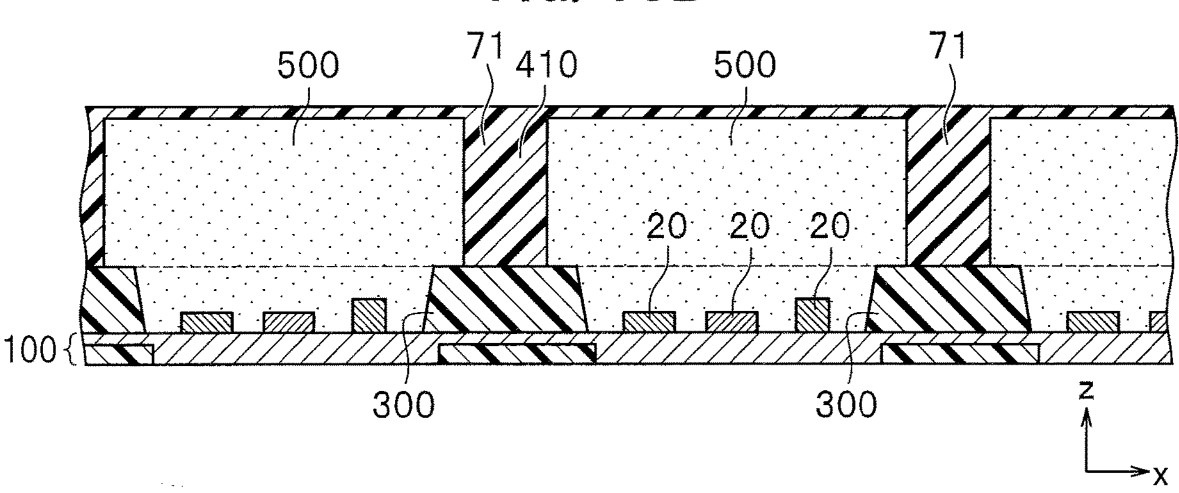
FIG. 10B is a schematic cross-sectional view of the method of manufacturing a light emitting device having the second wall variation.

A method of manufacturing a light emitting device 1B having a second wall 40 which is a variation will be explained with reference to FIG. 10A and FIG. 10B. FIG. 10A and FIG. 10B are cross-sectional views illustrating the state in each step.

The method of manufacturing a light emitting device 1B differs from the method of manufacturing a light emitting device 1 by not including a step S41 of disposing a second resin and a step S42 of forming a second groove in the step S40 of forming a second wall. The other aspects of the manufacturing method are basically consistent with the method of manufacturing a light emitting device 1. In the following paragraphs, only the differences from the method of manufacturing a light emitting device 1 will be explained.

A step S30 of forming a first groove will be explained based primarily on FIG. 10A. The method of manufacturing a light emitting device 1B differs from the method of manufacturing a light emitting device 1 in terms of the width of a first groove 71 which is smaller than the upper face of a first wall 300.

A step S43 of disposing a first resin will be explained based primarily on FIG. 10B. The method of manufacturing a light emitting device 1B differs from the method of manufacturing a light emitting device 1 such that the first resin 410 is disposed to cover at least the upper face of the first wall 300 and the lateral faces of the light transmissive member 500 that are exposed as a result of forming a first groove 71. This can form the inner lateral faces of the second wall 40 made only of the first resin 410. The first resin 410 is, for example, a resin having a light shielding property. In the example shown in FIG. 10B, the first resin 410 is disposed to cover the upper face of the light transmissive member 500.

Variation of Light Transmissive Member Disposing Step

A variation of the step S20 of disposing a light transmissive member will be explained with reference to FIG. 11A to FIG. 11D. FIG. 11A to FIG. 11D are cross-sectional views illustrating the state in each step. The step S20 of disposing a light transmissive member already explained can alternatively be conducted using this variation.

The variation of the step S20 of disposing a light transmissive member disposes a light transmissive member 500 in multiple steps. For example, the variation of the step S20 of disposing a light transmissive member includes a step of forming a first layer that covers the light emitting elements 20 and a step of forming a second layer disposed on the first layer 530A.

Figures 11A, 11B, 11C, 11D:
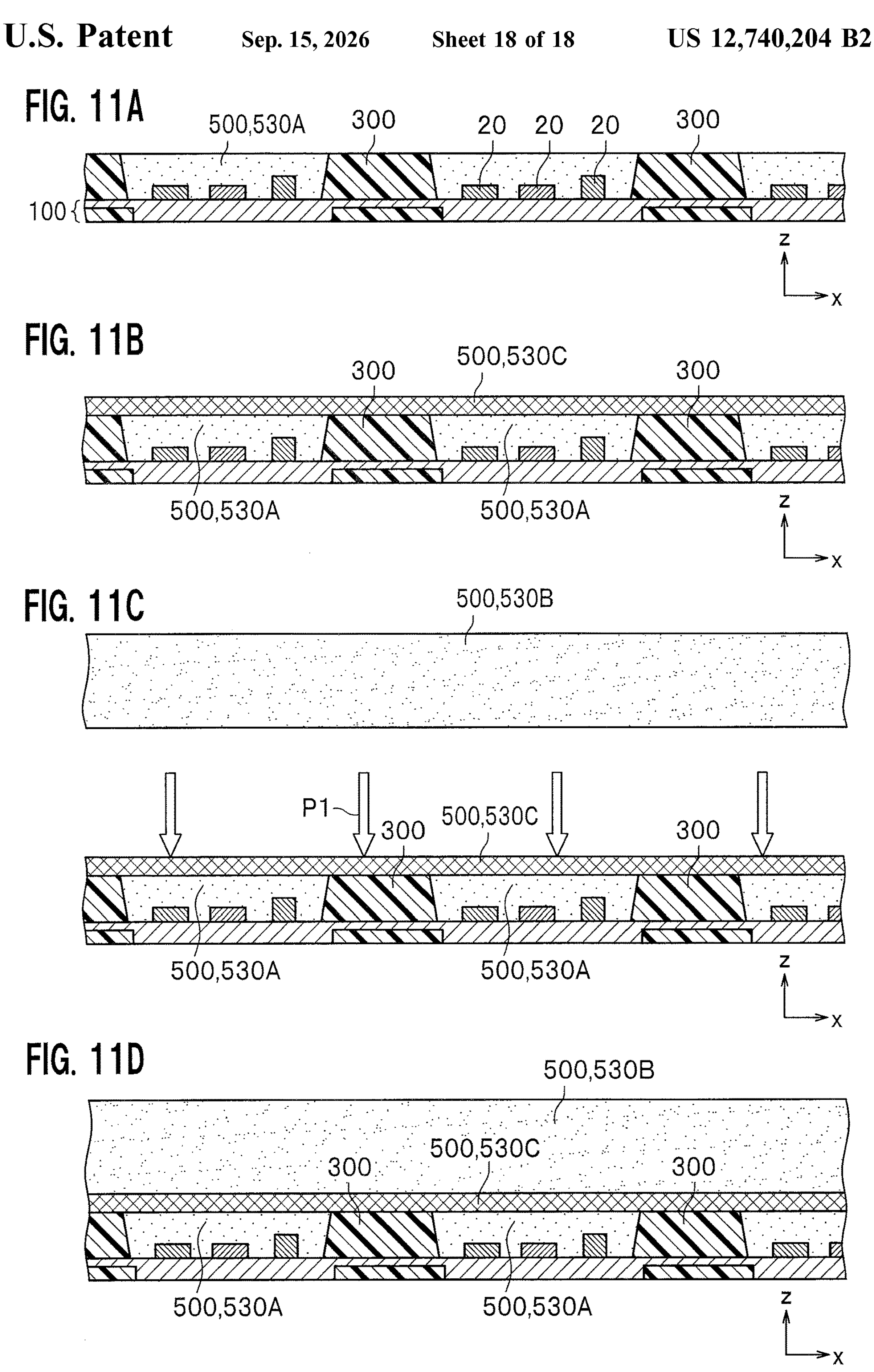
FIG. 11A is a schematic cross-sectional view illustrating the state after forming a first layer in a variation of the step of disposing a light transmissive member.
FIG. 11B is a schematic cross-sectional view illustrating the state after forming an activation layer in the variation of the step of disposing a light transmissive member.
FIG. 11C is a schematic cross-sectional view illustrating the state of applying plasma irradiation in the variation of the step of disposing a light transmissive member.
FIG. 11D is a schematic cross-sectional view illustrating the state after forming a second layer in the variation of the step of disposing a light transmissive member.

A step of forming a first layer will be explained based primarily on FIG. 11A. The step of forming a first layer is basically consistent with the step S20 of disposing a light transmissive member of the method of manufacturing a light emitting device 1 except for the height of the first layer 530A of the light transmissive member 500 being disposed. In a cross section, the height of the first layer 530A being disposed preferably matches the height of the first wall 300. This can reduce the voids that would be generated when bonded to the second layer 530B described later.

In a cross section, the height of the first layer 530A being disposed can be larger than the height of the first wall 300. In this case, the first layer is preferably disposed to cover the first wall 300. The first layer 530A is more preferably formed to have a flat upper face above the first wall 300 and above the light emitting elements 20. This can allow for the omission of the step of forming an activation layer 530C described later. The first layer 530A is hardened before forming a second layer. In the case of conducting the step of forming an activation layer described layer, the first layer 530A is hardened before the step of forming an activation layer.

A step of forming an activation layer will be explained based primarily on FIG. 11B. An activation layer 530C can be formed between the step of forming a first layer and the step of forming a second layer. The step of forming an activation layer can be conducted in the step of forming a second layer. The activation layer 530C is formed on the first layer 530A. The activation layer 530C is preferably formed also on the upper face of the first wall 300. This can form a continuous flat face across the upper faces of the first layer 530A and the first wall 300. This can reduce voids generated when the activation layer 530C is bonded with the second layer 530B described later.

The activation layer 530C is, for example, $SiO_2$. The activation layer 530C can be formed by vapor deposition, sputtering, or the like, for example. The thickness of the activation layer 530C is, for example, 5 nm to 100 nm.

A step of forming a second layer will be explained based primarily on FIG. 11C and FIG. 11D. The step of forming a second layer is a step of bonding a second layer 530B onto the first layer 530A. The second layer 530B is a sheet-shaped member hardened ahead of time. The first layer 530A and the second layer 530B are bonded by atmospheric pressure plasma activated bonding. Atmospheric pressure plasma activated bonding is a method of bonding the second layer 530B and the first layer 530A or the activation layer 530C in which the surface of the first layer 530A or the activation layer 530C is cleaned and activated by the irradiation of atmospheric plasma P1 followed by pressing and bonding the second layer 530B and the first layer 530A or the activation layer 530C.

For the material for the second layer 530B, one the same as or a similar to that for the light transmissive member 500 can be used. The material for the second layer 530B can be the same as or different from that for the first layer 530A.

In the case of employing the variation of the step S20 of disposing a light transmissive member in the method of manufacturing a light emitting device 2, the step S61 of disposing a first colored resin is modified. The first colored resin 520A is disposed on the light transmissive member 500 as the second layer 530B by atmospheric pressure plasma activated bonding.

The variation of the step S20 of disposing a light transmissive member can reduce the warping of the intermediate body 800 in the case of using a material for the light transmissive member 500 that is susceptible to warping, for example, in the case of employing an epoxy resin for the light transmissive member 500. The variation of the step S20 of disposing a light transmissive member bonds a hardened first layer 530A and a hardened second layer 530B. This can reduce the impact of the contraction of the light transmissive member 500 that occurs during the hardening process. This can thus reduce the warping of the intermediate body 800 with the light transmissive member 500 disposed thereon.

The method of manufacturing a light emitting device 1 according to the first embodiment, the method of manufacturing a light emitting device 2 according to the second embodiment, the method of manufacturing a light emitting device 1B with a second wall 40 variation, and the variation of the step S20 of disposing a light transmissive member can be combined with one another.

What is claimed is:

1. A light emitting device comprising:

a base including a first wall;

a light emitting element disposed on the base and surrounded by the first wall in a plan view;

a second wall positioned on an upper face of the first wall, the second wall having a light shielding part and a light reflecting part, the light reflecting part having a light reflectance higher than a light reflectance of the light shielding part; and a light transmissive member disposed in a cavity that is defined by the base and the second wall; wherein the light shielding part and the light reflecting part both contain a resin, an outer lateral face of the second wall and an outer lateral face of the first wall are continuously formed, the light reflecting part partly constitutes an inner lateral face of the second wall, the light shielding part constitutes the outer lateral face and an upper face of the second wall, and the light shielding part and the light reflecting part are in contact with the upper face of the first wall.

2. The light emitting device according to claim 1, wherein the cavity is defined by the first wall, the light reflecting part, and the light shielding part, and wherein the light reflecting part is positioned between the light shielding part and the first wall in the cavity.

3. The light emitting device according to claim 1, wherein the light reflecting part is white colored, and the light shielding part is black colored.

4. The light emitting device according to claim 1, wherein the light transmissive member is composed of a lower part that covers the light emitting element and an upper part positioned on the lower part, wherein the lower part is disposed in a portion defined by the base, and wherein the upper part is disposed in a portion defined by an upper face of the lower part and the second wall.

5. The light emitting device according to claim 4, wherein the upper part and the lower part have an interface therebetween, wherein the upper part is divided into three regions in a plan view, and wherein the three regions having different chromaticity from one another.

6. The light emitting device according to claim 1, wherein the light shielding part, the light reflecting part, and the light transmissive member contain a same base material.

7. The light emitting device according to claim 1, wherein the outer lateral face of the first wall and the outer lateral face of the second wall are coplanar.

8. The light emitting device according to claim 1, wherein the light reflecting part is disposed apart from the outer lateral face of the second wall.

9. The light emitting device according to claim 1, wherein the light reflecting part is disposed apart from the upper face of the second wall.

10. The light emitting device according to claim 1, wherein the light reflecting part is disposed apart from the outer lateral face and the upper face of the second wall.

11. The light emitting device according to claim 1, wherein in a cross-section, the light shielding part includes a first part in contact with the light reflecting part in a lateral direction and a second part not in contact with the light reflecting part in the lateral direction, and a maximum lateral length of the first part is smaller than a maximum lateral length of the second part.

12. The light emitting device according to claim 1, wherein in a cross-section, the light shielding part includes a first part in contact with the light reflecting part in a lateral direction, and a maximum lateral length of the first part is smaller than a maximum lateral length of the light reflecting part.

13. The light emitting device according to claim 1, wherein in a cross-section, the light shielding part includes a first part in contact with the light reflecting part in a lateral direction and a second part not in contact with the light reflecting part in the lateral direction, and a maximum lateral length of the second part is larger than a maximum lateral length of the first part and a maximum lateral length of the light reflecting part.

14. The light emitting device according to claim 1, wherein in a cross-section, a maximum vertical length of the light reflecting part is larger than a maximum lateral length of the light reflecting part.

* * * * *